United States Patent
Kim et al.

(10) Patent No.: US 10,614,762 B2
(45) Date of Patent: Apr. 7, 2020

(54) DISPLAY APPARATUS

(71) Applicant: LG DISPLAY CO., LTD., Seoul (KR)

(72) Inventors: Kyung-Rok Kim, Osan-si (KR);
Taegung Kim, Osan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/226,582

(22) Filed: Dec. 19, 2018

(65) Prior Publication Data

US 2019/0206325 A1 Jul. 4, 2019

(30) Foreign Application Priority Data

Dec. 29, 2017 (KR) .................. 10-2017-0184770

(51) Int. Cl.
*H05K 1/02* (2006.01)
*G06F 3/041* (2006.01)
(Continued)

(52) U.S. Cl.
CPC ......... *G09G 3/3241* (2013.01); *G09G 3/2096* (2013.01); *G09G 3/32* (2013.01); *G09G 3/3225* (2013.01); *G09G 3/3275* (2013.01); *G09G 2300/0842* (2013.01); *G09G 2300/0857* (2013.01); *G09G 2300/0861* (2013.01);
(Continued)

(58) Field of Classification Search
CPC ............... H05K 1/0296; H05K 3/1275; H05K 2201/09263; H05K 2201/09272; H05K 2201/09681; H05K 2201/0969; H05K 2203/0143; G06F 3/041; G06F 2203/04103; G06F 2203/04112
See application file for complete search history.

(56) References Cited

U.S. PATENT DOCUMENTS

2004/0150595 A1\* 8/2004 Kasai ................... G09G 3/2011
345/82
2004/0155841 A1\* 8/2004 Kasai ................... G09G 3/3233
345/76
(Continued)

FOREIGN PATENT DOCUMENTS

DE 11 2012 006 813 T5 5/2015
EP 3 188 244 A1 7/2017
(Continued)

*Primary Examiner* — Sejoon Ahn
(74) *Attorney, Agent, or Firm* — Polsinelli PC

(57) ABSTRACT

Disclosed is a display apparatus having a simplified configuration. The display apparatus includes a substrate including a display area including a plurality of pixel areas defined in a first direction and a second direction intersecting the first direction and a non-display area surrounding the display area, a plurality of pixels each including a pixel driving chip provided in a corresponding pixel area of the plurality of pixel areas of the substrate and a light emission part connected to the pixel driving chip, a plurality of pixel data transfer lines sequentially transferring digital pixel data to pixel driving chips of pixels arranged in the first direction, and a plurality of clock transfer lines sequentially transferring a reference clock to the pixel driving chips of the pixels arranged in the first direction. The pixel driving chip allows the light emission part to emit light, based on the digital pixel data and the reference clock input thereto.

13 Claims, 8 Drawing Sheets

(51) Int. Cl.
  *G09G 3/3241*   (2016.01)
  *G09G 3/3275*   (2016.01)
  *G09G 3/3225*   (2016.01)
  *G09G 3/20*     (2006.01)
  *G09G 3/32*     (2016.01)
  *H01L 27/12*    (2006.01)
  *H01L 27/32*    (2006.01)

(52) U.S. Cl.
  CPC ... *G09G 2310/08* (2013.01); *G09G 2320/064* (2013.01); *H01L 27/1248* (2013.01); *H01L 27/3246* (2013.01); *H01L 27/3258* (2013.01)

(56) References Cited

U.S. PATENT DOCUMENTS

| | | | |
|---|---|---|---|
| 2004/0257353 A1* | 12/2004 | Imamura | G09G 3/3233 345/204 |
| 2005/0243033 A1* | 11/2005 | Kim | G09G 3/3241 345/76 |
| 2006/0139252 A1* | 6/2006 | Lee | G09G 3/3241 345/76 |
| 2014/0146058 A1 | 5/2014 | Jeong et al. | |
| 2015/0154905 A1 | 6/2015 | Takanohashi et al. | |
| 2016/0055798 A1 | 2/2016 | Song et al. | |
| 2017/0330508 A1 | 11/2017 | Saito et al. | |

FOREIGN PATENT DOCUMENTS

| | | |
|---|---|---|
| KR | 20110129257 A | 12/2011 |
| KR | 20140051152 A | 4/2014 |
| TW | 535136 B | 6/2003 |

\* cited by examiner

DISPLAY APPARATUS

CROSS REFERENCE TO RELATED APPLICATION

This application claims the benefit of the Korean Patent Application No. 10-2017-0184770 filed on Dec. 29, 2017, which is hereby incorporated by reference in its entirety as if fully set forth herein.

BACKGROUND

Field of the Disclosure

The present disclosure relates to a display apparatus. Although the present disclosure is suitable for a wide scope of applications, it is particularly suitable for providing a display apparatus having a simplified configuration.

Description of the Background

Display apparatuses are being widely used as a display screen for various products such as televisions (TVs), notebook computers, and monitors as well as portable electronic devices such as mobile communication terminals, electronic notebooks, e-books, portable multimedia players (PMPs), navigation devices, ultra-mobile personal computers (PCs), mobile phones, smartphones, tablet personal computers (PCs), and watch phones.

Generally, the display apparatuses include a display panel including a plurality of pixels and a panel driving circuit for driving the plurality of pixels.

Each of the plurality of pixels includes a switching thin film transistor (TFT), a driving TFT, and one capacitor, which are provided on a substrate through a process of manufacturing TFTs. Recently, four or more TFTs need to be provided in one pixel, and moreover, as many as seven TFTs are required in one pixel.

The panel driving circuit includes a control board including a timing controller which receives video data from a display driving system or a display set and aligns the video data to generate digital data signals suitable for the display panel and a power management integrated circuit (IC) which generates various voltages, a plurality of data driving ICs which convert the digital data signals into analog data signals and supply the analog data signals to data lines of the display panel, and a plurality of flexible circuit films which connect the plurality of data driving ICs to the display panel, a source printed circuit board (PCB) which transfers an output signal of the control board to the plurality of flexible circuit films, a signal cable which connects the control board to the source PCB, and a plurality of gate driving circuits which drive gate lines of the display panel.

The display apparatuses have a complicated configuration due to the panel driving circuit disposed outside the display panel.

SUMMARY

Accordingly, the present disclosure is directed to providing a display apparatus that substantially obviates one or more problems due to limitations and disadvantages of the related art.

An aspect of the present disclosure is directed to providing a display apparatus having a simplified configuration.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate including a display area including a plurality of pixel areas defined in a first direction and a second direction intersecting the first direction and a non-display area surrounding the display area, a plurality of pixels each including a pixel driving chip provided in a corresponding pixel area of the plurality of pixel areas of the substrate and a light emission part connected to the pixel driving chip, a plurality of pixel data transfer lines sequentially transferring digital pixel data to pixel driving chips of pixels arranged in the first direction, and a plurality of clock transfer lines sequentially transferring a reference clock to the pixel driving chips of the pixels arranged in the first direction, wherein the pixel driving chip allows the light emission part to emit light, based on the digital pixel data and the reference clock input thereto.

In another aspect of the present disclosure, a display apparatus including a substrate having a display area and non-display area, wherein a plurality of pixel areas is defined at the display area in a first direction and a second direction intersecting the first direction and the non-display area surrounding the display area includes a pixel driving chip disposed in each pixel; a light emission part connected to the pixel driving chip; a plurality of pixel data transfer lines sequentially transferring digital pixel data to the pixel driving chip disposed in the pixel arranged in the first direction; and a plurality of clock transfer lines sequentially transferring a reference clock to the pixel driving chip disposed in the pixel arranged in the first direction, wherein the pixel driving chip controls an emission time of the light emission part by unit of frames and supplies a data current to the light emission part corresponding to the digital pixel data.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspects of the disclosure and together with the description serve to explain the principle of the disclosure.

In the drawings.

DETAILED DESCRIPTION OF THE DISCLOSURE

Figure 1:
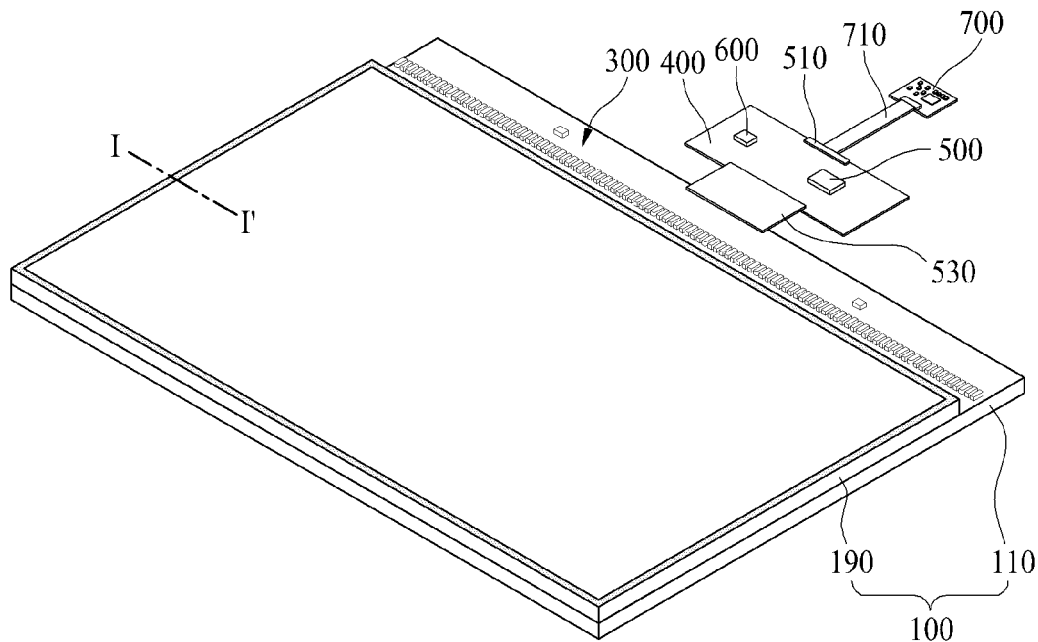
FIG. 1 is a diagram illustrating a display apparatus according to an aspect of the present disclosure.

Reference will now be made in detail to the exemplary aspects of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout. In the following description, when the detailed description of the relevant known technology is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, aspects of a display apparatus according to the present disclosure will be described in detail with reference to the accompanying drawings. In adding reference numerals to elements of each of the drawings, although the same elements are illustrated in other drawings, like reference numerals may refer to like elements. In the following description, when the detailed description of the relevant known function or configuration is determined to unnecessarily obscure the important point of the present disclosure, the detailed description will be omitted.

Figure 2:
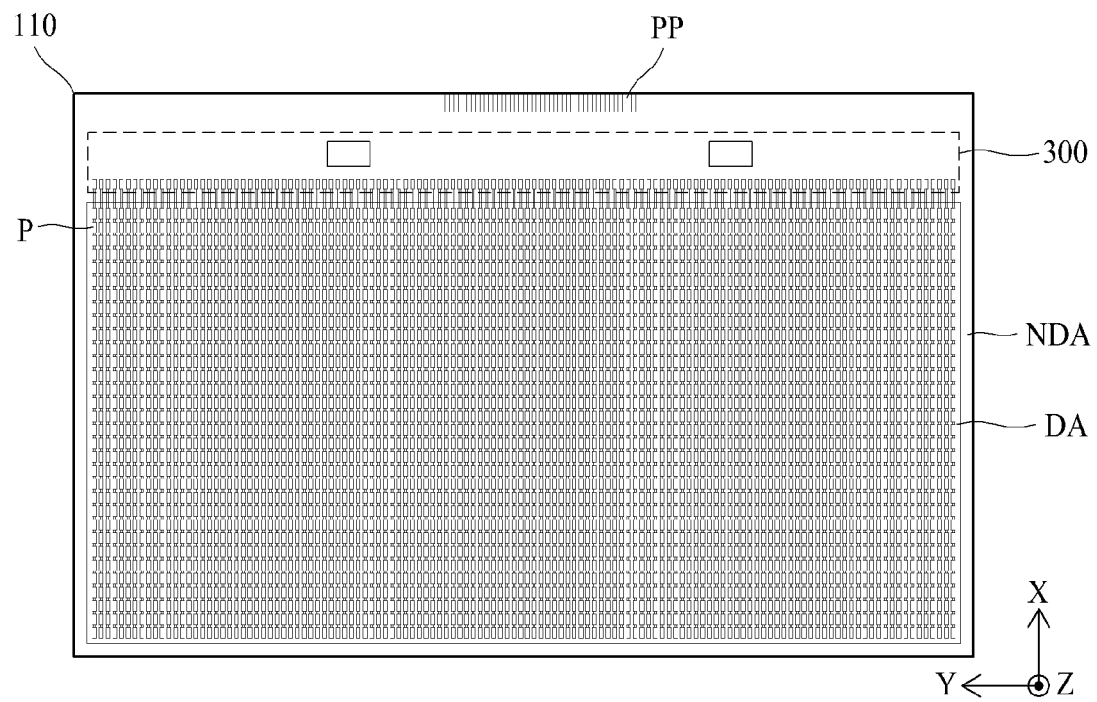
FIG. 2 is a plan view illustrating a substrate illustrated in FIG. 1.
Figure 3:
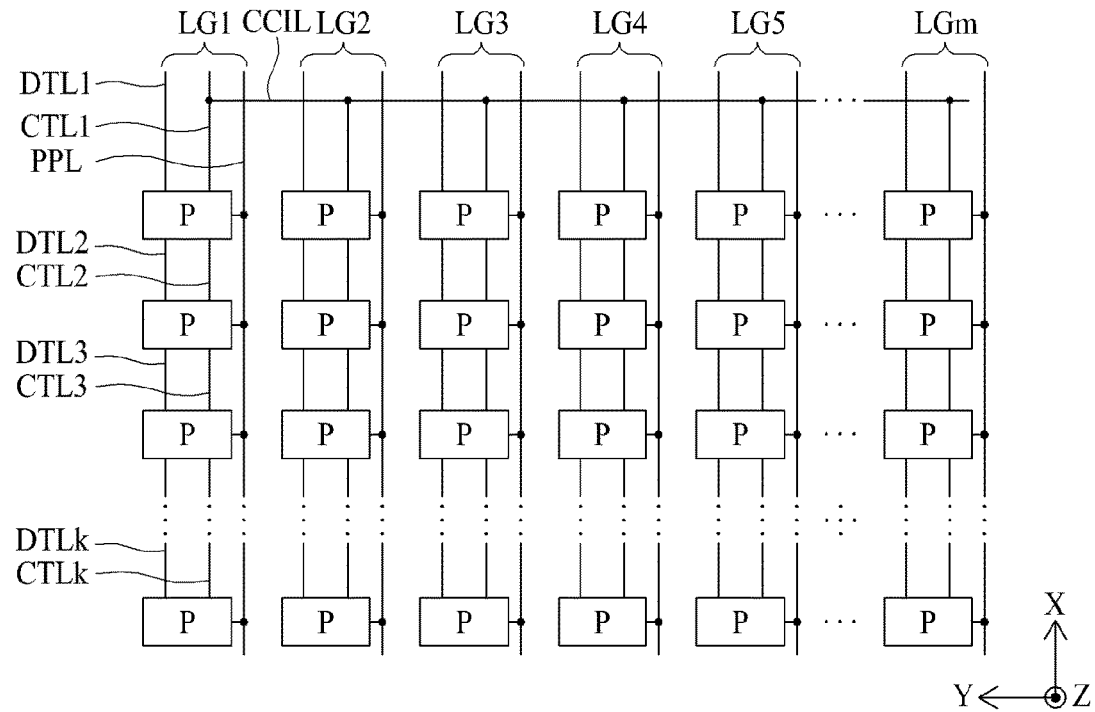
FIG. 3 is a diagram illustrating a connection structure between a pixel, a data transfer line, and a clock transfer line according to an aspect illustrated in FIG. 2.

FIG. 1 is a diagram illustrating a display apparatus according to an aspect of the present disclosure. FIG. 2 is a plan view illustrating a substrate illustrated in FIG. 1. FIG. 3 is a diagram illustrating a connection structure between a pixel, a data transfer line, and a clock transfer line according to an aspect illustrated in FIG. 2.

Referring to FIGS. 1 to 3, the display apparatus according to an example of the present disclosure may include a display panel 100 and a data driving circuit unit 300 mounted on the display panel 100.

The display panel 100 may include a substrate 110 and an opposite substrate 190, which face each other. The substrate 110 may be a pixel array substrate and may have a size which is larger than that of the opposite substrate 190, and thus, one edge of the substrate 110 may be exposed without being covered by the opposite substrate 190.

The substrate 110 may be formed of an insulating material such as glass, quartz, ceramic and plastic. For example, the substrate 110 including plastic may be a polyimide film, and particularly, may be a heat-resistant polyimide film capable of enduring a high temperature in a high temperature deposition process. The substrate 110 may include a display area DA including a plurality of pixel areas and a non-display area NDA. The display area DA may be defined as an area which displays an image, and the non-display area NDA may be an area which does not display an image and may be defined in an edge of the substrate 110 to surround the display area DA.

The substrate 110 according to an aspect may further include a plurality of pixels P and first to $m^{th}$ pixel driving line groups LG1 to LGm connected to the plurality of pixels P.

The first to $m^{th}$ pixel driving line groups LG1 to LGm may each be disposed between adjacent pixels of a plurality of pixels arranged in a first direction X and may sequentially transfer digital pixel data and a reference clock to the pixels P arranged in the first direction X. That is, the first to $m^{th}$ pixel driving line groups LG1 to LGm may sequentially transfer the digital pixel data and the reference clock to the pixels P arranged in the first direction X according to a cascade manner.

Each of the first to $m^{th}$ pixel driving line groups LG1 to LGm according to an aspect may include first to $k^{th}$ pixel data transfer lines DTL1 to DTLk, first to $k^{th}$ clock transfer lines CTL1 to CTLk, and a pixel driving power line PPL.

The first to $k^{th}$ pixel data transfer lines DTL1 to DTLk may be arranged at certain intervals on the substrate 110 in the first direction X. That is, each of the first to $k^{th}$ pixel data transfer lines DTL1 to DTLk may be disposed between two adjacent pixels of the pixels P arranged in the first direction X and may be electrically connected to two pixels P adjacent to each other in the first direction X. Each of the first to $k^{th}$ pixel data transfer lines DTL1 to DTLk may transfer corresponding digital pixel data to corresponding pixels of the plurality of pixels P arranged in the first direction X in order. That is, digital pixel data which is to be supplied to each of the plurality of pixels P may sequentially pass through pixels P disposed at a front stage and may be supplied to corresponding pixels P. In this case, each of the first to $k^{th}$ pixel data transfer lines DTL1 to DTLk may be referred to as a serial data bus.

The first to $k^{th}$ clock transfer lines CTL1 to CTLk may be respectively arranged on the substrate 110 in parallel to the first to $k^{th}$ pixel data transfer lines DTL1 to DTLk. That is, each of the first to $k^{th}$ clock transfer lines CTL1 to CTLk may be disposed between two adjacent pixels of the plurality of pixels P arranged in the first direction X and may be electrically connected to two pixels P adjacent to each other in the first direction X. Each of the first to $k^{th}$ clock transfer lines CTL1 to CTLk may transfer the reference clock to each of the plurality of pixels P arranged in the first direction X in order. In this case, the reference clock may be supplied to a clock transfer line CTL1 of each of the first to $m^{th}$ pixel driving line groups LG1 to LGm, and in this case, an upper portion of the clock transfer line CTL1 of each of the first to $m^{th}$ pixel driving line groups LG1 to LGm may be connected to a common clock input line CCIL disposed in a second direction Y. In this case, the reference clock may be a signal having a period corresponding to one horizontal period.

The pixel driving power line PPL may be disposed on the substrate 110 in parallel to each of the first to $k^{th}$ clock transfer lines CTL1 to CTLk. The pixel driving power line PPL according to an aspect may be disposed between at least two pixels in the second direction Y and may transfer a pixel driving voltage to the pixels P arranged in the first direction X. For example, the pixel driving power line PPL may be disposed between two pixels adjacent to each other in the second direction Y, or may be disposed between two adjacent unit pixels. In this case, a unit pixel may include three adjacent red pixel, green pixel, and blue pixel.

The opposite substrate 190 may be an encapsulation substrate or a color filter array substrate including a color filter. The opposite substrate 190 may cover the plurality of pixels P provided on the substrate 110. The opposite substrate 190 according to an aspect may be a glass substrate, a metal foil, a thin metal substrate, a flexible substrate, a plastic film, or the like. For example, the opposite substrate 190 may be a polyethylene terephthalate film, a polyimide film, or the like. The opposite substrate 190 may be bonded to the substrate 110 by a transparent adhesive layer.

The data driving circuit unit 300 may be provided in the non-display area NDA of the substrate 110 and may be connected to the first to $k^{th}$ pixel data transfer lines DTL1 to DTLk.

The data driving circuit unit 300 according to an aspect may generate digital pixel data, the reference clock, and a data start signal from a data interface signal which is supplied through a pad part PP disposed in a first non-display area (or an upper non-display area) of the substrate 110, and based on the generated reference clock and data start signal, the data driving circuit unit 300 may align the digital pixel data according to a pixel arrangement structure and may supply the aligned digital pixel data to a first pixel data transfer line DTL1 of a corresponding pixel driving line group of the first to $m^{th}$ pixel driving line groups LG1 to LGm according to a serial data communication manner. For example, the data driving circuit unit 300 may include at least one data driving chip which transfers digital pixel data to a corresponding pixel through a corresponding pixel data transfer line of the first to $k^{th}$ pixel data transfer lines DTL1 to DTLk.

The display apparatus according to an aspect of the present disclosure may include a control board 400, a timing controller 500, a power management circuit 600, and a display driving system 700.

The control board 400 may be connected to, through the signal cable 530, the pad part PP disposed in one non-display area of the substrate 110.

The timing controller 500 may be mounted on the control board 400. The timing controller 500 may perform signal processing on an image signal input thereto to generate digital pixel data and may supply the digital data signal to the data driving circuit unit 300. That is, the timing controller 500 may receive the image signal and a timing synchronization signal supplied from the display driving system 700 through a user connector 510 provided on the control board 400. The timing controller 500 may align the image signal to generate the digital pixel data matching a pixel arrangement structure of the display area DA, based on the timing synchronization signal and may supply the generated digital pixel data to the data driving circuit unit 300. The timing controller 500 according to an aspect may supply the digital data signal, the reference clock, and the data start signal to the data driving circuit unit 300 by using a high speed serial interface manner (for example, an embedded point to point interface (EPI) manner, a low-voltage differential signaling (LVDS) interface manner, or a mini LVDS interface manner).

The timing controller 500 according to an aspect may supply the digital pixel data to the data driving circuit unit 300, based on a predetermined sequential emission driving manner of the display panel 100. According to an aspect, the timing controller 500 may supply the digital pixel data to the data driving circuit unit 300, based on a predetermined simultaneous emission driving manner of the display panel 100.

The power management circuit 600 may generate a transistor logic voltage, a ground voltage, and a pixel driving voltage, based on an input power supplied from a power supply of the display driving system 700. Each of the transistor logic voltage and the ground voltage may be used as a driving voltage for the timing controller 500 and the data driving circuit unit 300, and the ground voltage and the pixel driving voltage may be applied to the data driving circuit unit 300 of each of the plurality of pixels P.

The display driving system 700 may be connected to the user connector 510 of the control board 400 through an interface cable 710. The display driving system 700 may generate the image signal from a video source and may supply the image signal to the timing controller 500. In this case, the image signal may be supplied to the timing controller 500 by using the high speed serial interface manner (for example, a V-by-one interface manner).

Figure 4:
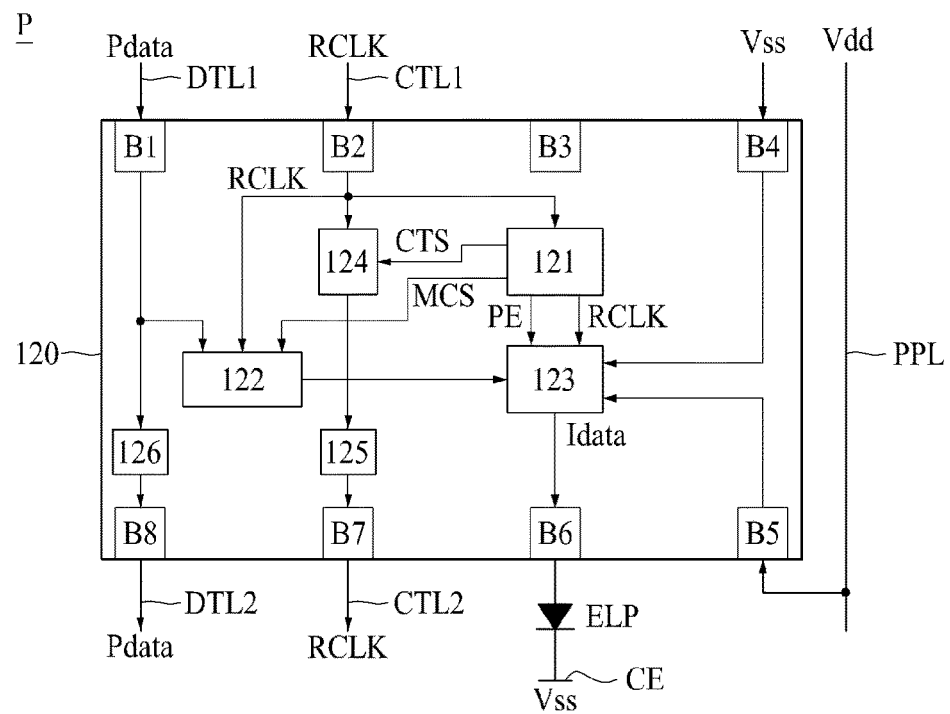
FIG. 4 is a diagram illustrating a pixel according to an aspect of the present disclosure illustrated in FIG. 3.

FIG. 4 is a diagram illustrating a pixel according to an aspect of the present disclosure illustrated in FIG. 3 and illustrates a first pixel illustrated in FIG. 3.

Referring to FIG. 4 in conjunction with 3, a pixel P according to an aspect of the present disclosure may include a pixel driving chip 120 and a light emission part ELP.

The pixel driving chip 120 may be a minimum-unit microchip or one chipset and may be a semiconductor packaging device which includes two or more transistors and one or more capacitors and has a fine size. The pixel driving chip 120 may be provided in a predetermined touch sensing pixel area of a plurality of pixel areas and may control an emission time of the light emission part ELP by units of frames, according to a reference clock RCLK, digital pixel data Pdata, and a pixel driving voltage Vdd input thereto.

The pixel driving chip 120 according to an aspect may include first to eighth bumps B1 to B8, a pixel controller 121, a pixel memory 122, a pixel driving circuit 123, and a clock transfer circuit 124. In this case, a bump may be referred to as a pin or a terminal.

The first bump B1 may be referred as a data receiving terminal, the second bump B2 may be referred as a clock receiving terminal, the third bump B3 may be referred as a no connection (NC) terminal, the fourth bump B4 may be referred as a cathode power terminal, the fifth bump B5 may be referred as a pixel driving power terminal, the sixth bump B6 may be referred as an anode connection terminal, the seventh bump B7 may be referred as a clock output terminal, and the eighth bump B8 may be referred as a data transfer terminal.

The pixel controller 121 may control an overall operation of the pixel driving chip 120 and a driving timing of the light emission part ELP, based on the reference clock RCLK input through the second bump B2 from the clock transfer line CTL1 of the first pixel driving line group LG1.

The pixel controller 121 may generate and output a memory control signal MCS, a pixel enable signal PE, and a clock transfer signal CTS for a predetermined pixel operation timing, based on the reference clock RCLK. For example, the memory control signal MCS may be a signal for storing digital pixel data in the pixel memory 122 or outputting the digital pixel data stored in the pixel memory 122. The pixel enable signal PE may be a signal for controlling light emission of the light emission part ELP, based on the digital pixel data stored in the pixel memory 122. Also, the clock transfer signal CTS may be a signal for transferring the reference clock RCLK, input to the pixel driving chip 120, to a pixel driving chip 120 of a next stage pixel.

Moreover, the pixel controller 121 may transfer the reference clock RCLK, input through the second bump B2, to the pixel driving circuit 123.

The pixel memory 122 may receive the digital pixel data Pdata through the first bump B1 from the first pixel data transfer line DTL1 of the first pixel driving line group LG1 and may receive the reference clock RCLK through the second bump B2 from the clock transfer line CTL1 of the first pixel driving line group LG1. The pixel memory 122 may store the digital pixel data Pdata input thereto, based on the reference clock RCLK input thereto. For example, the pixel memory 122 may change to a write mode according to the memory control signal MCS having a first logic state supplied from the pixel controller 121 and may store the digital pixel data Pdata, based on the reference clock RCLK. Also, the pixel memory 122 may change to a read mode according to the memory control signal MCS having a second logic state supplied from the pixel controller 121 and may output the stored digital pixel data Pdata to the pixel driving circuit 123 according to the reference clock RCLK.

The pixel driving circuit 123 may be enabled by the pixel enable signal PE input from the pixel controller 121 and may output a data current Idata corresponding to the digital pixel data Pdata, based on the reference clock RCLK, the digital pixel data Pdata, the pixel driving voltage Vdd, and a cathode voltage Vss. In this case, the reference clock RCLK may be transferred from the pixel controller 121. The digital pixel data Pdata may be input through the first bump B1 from the first pixel data transfer line DTL1 of the first pixel driving line group LG1. The pixel driving voltage Vdd may be input through the fifth bump B5 from the pixel driving power line PPL of the first pixel driving line group LG1. The cathode voltage Vss may be input through the fourth bump B4. The data current Idata output from the pixel driving circuit 123 may be supplied to the light emission part ELP through the sixth bump B6.

The clock transfer circuit 124 may selectively connect the second bump B2 to the seventh bump B7 according to the clock transfer signal CTS supplied from the pixel controller 121. For example, during a clock blocking period corresponding to a period in which the pixel driving chip 120 receives and processes the digital pixel data, the clock transfer circuit 124 may be turned off according to the clock transfer signal CTS having the first logic state supplied from the pixel controller 121 and may electrically disconnect the second bump B2 from the seventh bump B7. Also, during the other period except the clock blocking period, the clock transfer circuit 124 may be turned on according to the clock transfer signal CTS having the second logic state supplied from the pixel controller 121 and may output the reference clock RCLK, input through the second bump B2, to the seventh bump B7. The reference clock RCLK output to the seventh bump B7 may be transferred to a pixel driving chip 120 of a pixel P disposed at a next stage (or a rear stage) through the second clock transfer line CTL2 of the first pixel driving line group LG1.

The clock transfer circuit 124 according to an aspect may include a switch element. The switch element may include a gate terminal receiving the clock transfer signal CTS supplied from the pixel controller 121, a first source/drain terminal connected to the second bump B2, and a second source/drain terminal connected to the seventh bump B7. In this case, the first and second source/drain terminals of the switch element may act as a source terminal or a drain terminal, based on a direction of a current.

The pixel driving chip 120 according to an aspect may further include a first buffer circuit 125. The first buffer circuit 125 may buffer the reference clock RCLK input through the clock transfer circuit 124 and may output the buffered reference clock RCLK to the seventh bump B7. The first buffer circuit 125 according to an aspect may include an inverter type buffer and may include an even number of inverters serially connected between an output terminal of the clock transfer circuit 124 and the seventh bump B7. For example, the first buffer circuit 125 may buffer the reference clock RCLK input through the clock transfer circuit 124 by using the pixel driving voltage Vdd input through the fifth bump B5 and the cathode voltage Vss input through the fourth bump B4 and may output the buffered reference clock RCLK to the seventh bump B7, thereby preventing the voltage drop of the reference clock RCLK.

The pixel driving chip 120 according to an aspect may further include a second buffer circuit 126. The second buffer circuit 126 may buffer the digital pixel data Pdata input through the first bump B1 and may output the buffered digital pixel data Pdata to the eighth bump B8. The second buffer circuit 126 according to an aspect may include an inverter type buffer and may include an even number of inverters serially connected between the first bump B1 and the eighth bump B8. For example, the second buffer circuit 126 may buffer the digital pixel data Pdata input thereto by using the pixel driving voltage Vdd input through the fifth bump B5 and the cathode voltage Vss input through the fourth bump B4 and may output the buffered digital pixel data Pdata to the eighth bump B8, thereby preventing the voltage drop of digital pixel data Pdata.

The light emission part ELP may emit light with the data current Idata supplied from the pixel driving chip 120. The light emitted from the light emission part ELP may be output to the outside through the opposite substrate 190, or may be output to the outside through the substrate 110.

The light emission part ELP according to an aspect may include an anode electrode (or a first electrode) connected to the sixth bump B6 of the pixel driving chip 120, a light emitting layer connected to the anode electrode, and a cathode electrode (or a second electrode) CE connected to the light emitting layer. The light emitting layer may include one of an organic light emitting layer, an inorganic light emitting layer, and a quantum dot light emitting layer, or may include a stacked or mixed structure including the organic light emitting layer (or the inorganic light emitting layer) and the quantum dot light emitting layer.

Figure 5:
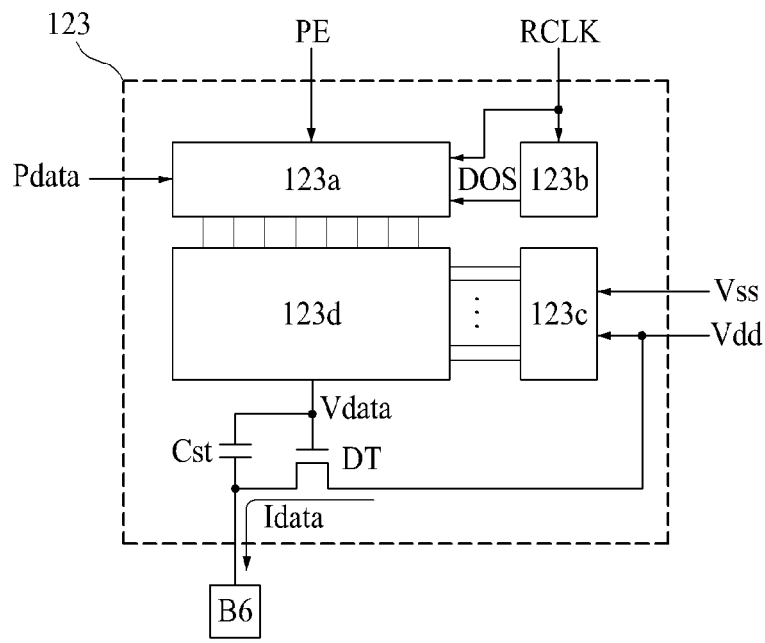
FIG. 5 is a diagram illustrating a pixel driving circuit according to an aspect of the present disclosure illustrated in FIG. 4.

FIG. 5 is a diagram illustrating a pixel driving circuit 123 according to an aspect of the present disclosure illustrated in FIG. 4.

Referring to FIG. 5 in conjunction with FIG. 4, the pixel driving circuit 123 according to an aspect of the present disclosure may include a data parallelization circuit 123a, a clock counter 123b, a grayscale voltage generator 123c, a grayscale voltage selector 123d, a driving transistor DT, and a capacitor Cst.

The data parallelization circuit 123a may be enabled according to the pixel enable signal PE and may receive and parallelize the digital pixel data Pdata which is input in a serial data communication manner, based on the reference clock RCLK. Also, the data parallelization circuit 123a may simultaneously output parallel digital pixel data according to a parallel data output signal DOS.

The clock counter 123b may count the reference clock RCLK to generate the parallel data output signal DOS, thereby controlling a data output of the data parallelization circuit 123a. The clock counter 123b according to an aspect may generate and output the parallel data output signal DOS, based on the predetermined sequential emission driving manner or simultaneous emission driving manner of the display panel 100.

In a case where the display panel 100 is driven by the sequential emission driving manner, the clock counter 123b may count a number of reference clocks RCLK corresponding to a period in which the data parallelization circuit 123a parallelizes serial digital pixel data Pdata into parallel digital pixel data Pdata, thereby generating the parallel data output signal DOS. In this case, the data parallelization circuit 123a may simultaneously output the parallel digital pixel data Pdata according to the parallel data output signal DOS which is input immediately after the serial digital pixel data Pdata is parallelized. In a case where the display panel 100 is driven by the sequential emission driving manner, a plurality of pixels P provided in the display panel 100 may sequentially emit light by units of horizontal lines.

In a case where the display panel 100 is driven by the simultaneous emission driving manner, the clock counter 123b may count the reference clocks RCLK by units of frames to generate the parallel data output signal DOS at a start time of each frame. That is, the clock counter 123b may generate the parallel data output signal DOS at a start time of a new frame after the serial digital pixel data Pdata sequentially pass through the first to $k^{th}$ pixel data transfer lines DTL1 to DTLk and a plurality of pixel driving chips 120 and are supplied to pixels of a last horizontal line, based on a cascade manner. In this case, the data parallelization circuit 123a may parallelize and hold the serial digital pixel data Pdata, and then, may simultaneously output the parallel digital pixel data Pdata according to the parallel data output signal DOS input at a start time of a new frame. In a case where the display panel 100 is driven by the simultaneous emission driving manner, light emission parts ELP of all of the plurality of pixels P provided in the display panel 100 may simultaneously emit lights, thereby preventing motion blur caused by the impulse driving of an image. During an emission period of a frame where the light emission parts ELP of all of the plurality of pixels P provided in the display panel 100 simultaneously emit lights, new digital pixel data may be updated in the pixel memory 122 of each of the plurality of pixels P.

The grayscale voltage generator 123c may divide a voltage between the pixel driving voltage Vdd and the cathode voltage Vss to generate a plurality of grayscale voltages respectively corresponding to a plurality of grayscale values based on the number of bits of the digital pixel data.

The grayscale voltage selector 123d may select, as a data voltage Vdata, one grayscale voltage corresponding to a grayscale value of the parallel digital pixel data Pdata simultaneously input from the data parallelization circuit 123a among the plurality of grayscale voltages supplied from the grayscale voltage generator 123c and may output analog data voltage Vdata, thereby converting the digital pixel data Pdata into the analog data voltage Vdata. The grayscale voltage generator 123c and the grayscale voltage selector 123d may be referred to as a digital-to-analog converter part.

The driving transistor DT may include a gate electrode receiving the data voltage Vdata from the grayscale voltage selector 123d, a source electrode connected to the anode electrode of the light emission part ELP through the sixth bump B6, and a drain electrode receiving the pixel driving voltage Vdd. The driving transistor DT may control the data current Idata which flows from a pixel driving voltage Vdd source to the light emission part ELP through the sixth bump B6, based on the data voltage Vdata input thereto, thereby controlling light emission of the light emission part ELP.

The capacitor Cst may be connected between the gate electrode and the source electrode of the driving transistor DT. The capacitor Cst may store a voltage corresponding to the data voltage Vdata supplied to the gate electrode of the driving transistor DT and may turn on the driving transistor DT with the stored voltage.

Figure 6:
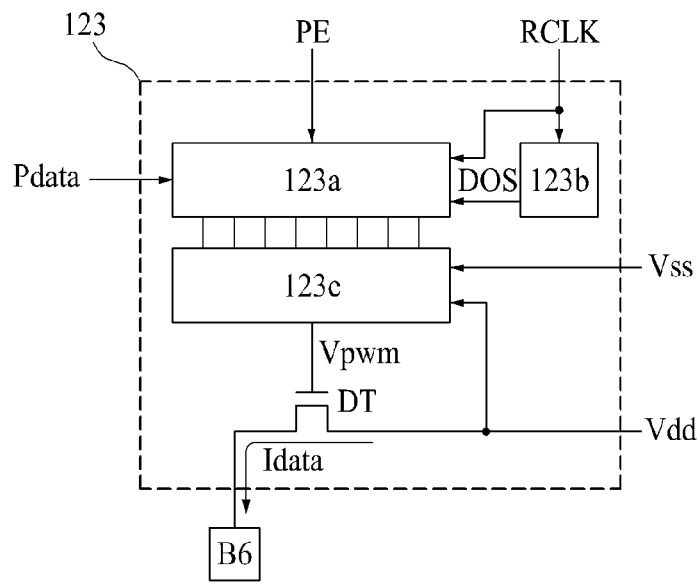
FIG. 6 is a diagram illustrating a pixel driving circuit according to another aspect of the present disclosure illustrated in FIG. 4.

FIG. 6 is a diagram illustrating a pixel driving circuit 123 according to another aspect of the present disclosure illustrated in FIG. 4.

Referring to FIG. 6 in conjunction with FIG. 4, the pixel driving circuit 123 according to another aspect of the present disclosure may include a data parallelization circuit 123a, a clock counter 123b, a duty controller 123e, and a driving transistor DT.

The data parallelization circuit 123a may be enabled according to the pixel enable signal PE and may receive and parallelize the digital pixel data Pdata which is input in the serial data communication manner, based on the reference clock RCLK. Also, the data parallelization circuit 123a may simultaneously output parallel digital pixel data according to a parallel data output signal DOS.

The clock counter 123b may count the reference clock RCLK to generate the parallel data output signal DOS, thereby controlling a data output of the data parallelization circuit 123a. The clock counter 123b according to an aspect may generate and output the parallel data output signal DOS, based on the predetermined sequential emission driving manner or simultaneous emission driving manner of the display panel 100. The clock counter 123b is simultaneously the same as the clock counter illustrated in FIG. 5, and thus, its overlapping description will be omitted.

The duty controller 123e may generate and output a pulse width modulation signal Vpwm for controlling a turn-on time of the driving transistor DT in one frame, based on a grayscale value of the parallel digital pixel data Pdata supplied from the data parallelization circuit 123a. The duty controller 123e according to an aspect may generate the pulse width modulation signal Vpwm having a duty on period corresponding to the grayscale value of the parallel digital pixel data Pdata, based on 100% duty which is set as a whole emission period in one frame. For example, when the grayscale value of the parallel digital pixel data Pdata input to the duty controller 123e has a grayscale value "511" with respect to 10-bit digital pixel data Pdata, the duty controller 123e may generate the pulse width modulation signal Vpwm having the duty on period of 22%, but is not limited thereto. In other aspects, the duty on period may be changed based on the number of bits of the digital pixel data Pdata, a luminance of the display apparatus, or a frame time.

The driving transistor DT may include a gate electrode receiving the pulse width modulation signal Vpwm from the duty controller 123e, a source electrode connected to the anode electrode of the light emission part ELP through the sixth bump B6, and a drain electrode receiving the pixel driving voltage Vdd. The driving transistor DT may be turned on during the duty on period corresponding to the pulse width modulation signal Vpwm input thereto and may control the data current Idata which flows from a pixel driving voltage Vdd source to the light emission part ELP through the sixth bump B6, thereby controlling light emission of the light emission part ELP. In this case, the pixel driving voltage Vdd may have a voltage level corresponding to a maximum grayscale value of the digital pixel data Pdata, and for example, may have a voltage level corresponding to a white grayscale value.

Figure 7:
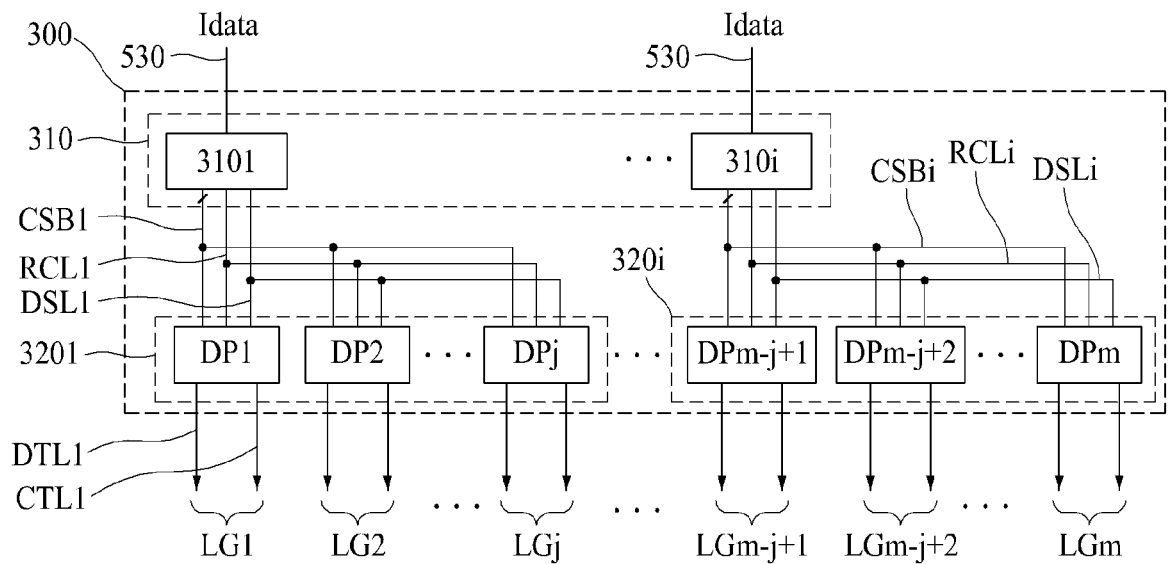
FIG. 7 is a diagram illustrating a data driving circuit unit according to an aspect of the present disclosure illustrated in FIGS. 1 and 2.

FIG. 7 is a diagram illustrating a data driving circuit unit 300 according to an aspect of the present disclosure illustrated in FIGS. 1 and 2.

Referring to FIG. 7 in conjunction with FIGS. 1 and 2, the data driving circuit unit 300 according to an aspect of the present disclosure includes a data receiving circuit 310 and first to $m^{th}$ data processing circuits DP1 to DPm.

The data receiving circuit 310 may be mounted on the control board 400. The data receiving circuit 310 may receive a digital data signal Idata input from the timing controller 500 mounted on the control board 400 to output digital pixel data corresponding to at least one horizontal line. The data receiving circuit 310 may receive the digital data signal Idata based on a differential signal transferred from the timing controller 500 according to the high speed serial interface manner, generate digital pixel data corresponding to at least one horizontal line, based on the received digital data signal Idata, and generate a dot clock, a reference clock, and a data start signal from the differential signal. In this case, the digital data signal Idata may be transferred from the timing controller 500 to the data receiving circuit 310 according to the high speed serial interface manner (for example, the EPI manner, the LVDS interface manner, or the mini LVDS interface manner).

The data receiving circuit 310 according to an aspect may include first to $i^{th}$ (where i is a natural number equal to or more than two) data receiving chips 3101 to 310i. In this case, each of the first to $i^{th}$ data receiving chips 3101 to 310i may be a minimum-unit microchip or one chipset and may be a semiconductor packaging device which includes an integrated circuit (IC) including transistors and has a fine size.

Each of the first to $i^{th}$ data receiving chips 3101 to 310i may individually receive digital data signals to be supplied to j pixels (where j is a natural number equal to or more than two) among differential signals transferred from the timing controller 500 through one signal cable 530, individually generate pixel data to be supplied to the j pixels, based on the received digital data signals, and individually generate a dot clock, a reference clock, and a data start signal from the differential signals. For example, when the signal cable 530 has first to $i^{th}$ pairs, the first data receiving chip 3101 may individually receive digital data signals corresponding to first to $i^{th}$ pixels from the differential signals transferred from the timing controller 500 through the first pair of the signal cable 530, individually generate pixel data corresponding to the first to $j^{th}$ pixels, based on the received digital data signals, and individually generate a dot clock, a reference clock, and a data start signal from the differential signals. Also, the $i^{th}$ data receiving chip 310i may individually receive digital data signals corresponding to $m-j+1^{th}$ to $m^{th}$ pixels from the differential signals transferred from the timing controller 500 through the $i^{th}$ pair of the signal cable 530, individually generate pixel data corresponding to the $m-j+1^{th}$ to $m^{th}$ pixels, based on the received digital data signals, and individually generate a dot clock, a reference clock, and a data start signal from the differential signals.

The first to $i^{th}$ data receiving chips 3101 to 310i may individually output digital pixel data through a serial data communication manner using first to $i^{th}$ common serial data buses CSB1 to CSBi each having a data bus corresponding to the number of bits of the digital pixel data, individually output the reference clock to first to $i^{th}$ common reference clock lines RCL1 to RCLi, and individually output the data start signal to first to $i^{th}$ data start signal lines DSL1 to DSLi. For example, the first data receiving chip 3101 may transfer corresponding digital pixel data, a corresponding reference clock, and a corresponding data start signal through the first common serial data bus CSB1, the first common reference clock line RCL1, and the first data start signal line DSL1. Also, the $i^{th}$ data receiving chip 310i may transfer corresponding pixel data, a corresponding reference clock, and a corresponding data start signal through the $i^{th}$ common serial data bus CSBi, the $i^{th}$ common reference clock line RCLi, and the $i^{th}$ data start signal line DSLi.

The data receiving circuit 310 according to an aspect may be configured with one data receiving chip. That is, the first to $i^{th}$ data receiving chips 3101 to 310i may be integrated into one data integration receiving chip.

Each of the first to $m^{th}$ data processing circuits DP1 to DPm may sample and hold in parallel digital pixel data transferred from the data receiving circuit 310 according to a data start signal and a reference clock input thereto and may output the input reference clock and the held digital pixel data according to the serial data communication manner. In this case, each of the first to $m^{th}$ data processing circuits DP1 to DPm may be a minimum-unit microchip or one chipset and may be a semiconductor packaging device which includes an IC including transistors and has a fine size.

The first to $m^{th}$ data processing circuits DP1 to DPm may be grouped into first to $i^{th}$ data processing groups 3201 to 320$i$, and in this case, each of the first to $i^{th}$ data processing groups 3201 to 320$i$ may include j data processing circuits.

On a group basis, the data processing circuits grouped into the first to $i^{th}$ data processing groups 3201 to 320$i$ may be connected to the first to $i^{th}$ common serial data buses CSB1 to CSBi in common. For example, each of the first to $j^{th}$ data processing circuits DP1 to DPj grouped into the first data processing group 3201 may receive corresponding digital pixel data, a corresponding reference clock, and a corresponding data start signal through the first common serial data bus CSB1, the first common reference clock line RCL1, and the first data start signal line DSL1. Also, each of m–j+$1^{th}$ to $m^{th}$ data processing circuits DPm–j+1 to DPm grouped into the $i^{th}$ data processing group 320$i$ may receive corresponding digital pixel data, a corresponding reference clock, and a corresponding data start signal through the $i^{th}$ common serial data bus CSBi, the $i^{th}$ common reference clock line RCLi, and the $i^{th}$ data start signal line DSLi.

When digital pixel data having a corresponding number of bits is sampled and held, each of the first to $m^{th}$ data processing circuits DP1 to DPm may output a reference clock input thereto to a first clock transfer line CTL1 of each of first to $m^{th}$ pixel driving line groups LG1 to LGm and may output the held digital pixel data to a first pixel data transfer line DTL1 of each of the first to $m^{th}$ pixel driving line groups LG1 to LGm according to the serial data communication manner.

Each of the first to $m^{th}$ data processing circuits DP1 to DPm according to an aspect may include a latch circuit which samples and latches digital pixel data input through a corresponding common serial data bus CSB according to the reference clock in response to the data start signal, a counter circuit which counts the reference clock to generate a data output signal, and a clock bypass circuit which bypasses the reference clock input thereto.

Figure 8:
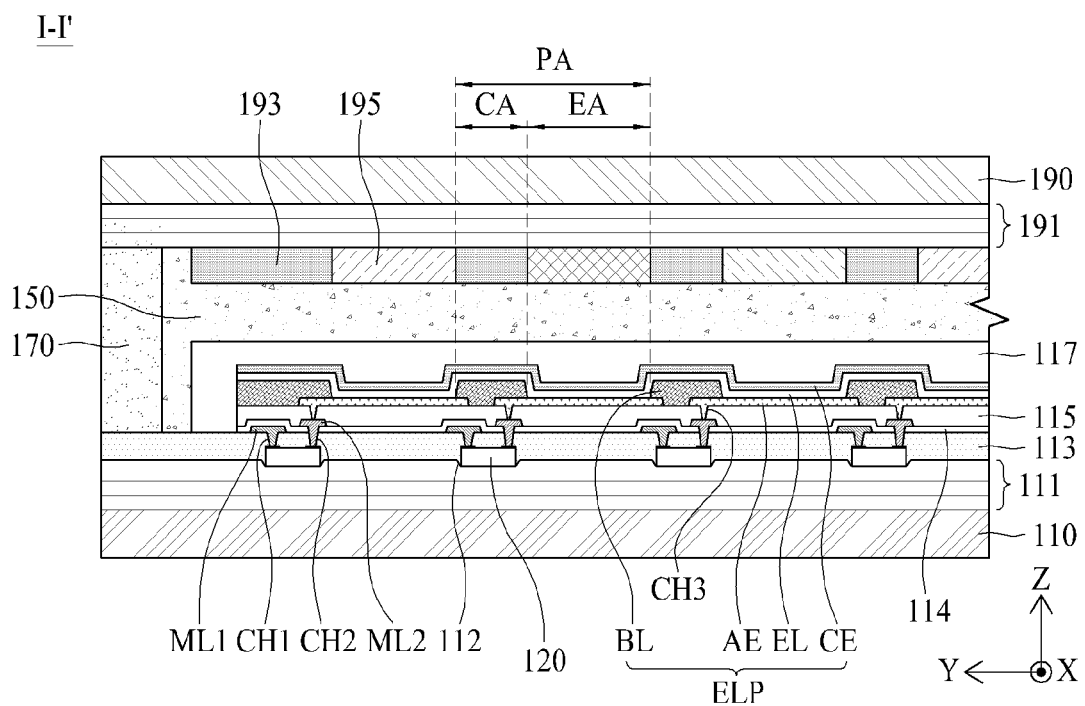
FIG. 8 is a cross-sectional view taken along line I-I' illustrated in FIG. 1.

FIG. 8 is a cross-sectional view taken along line I-I' illustrated in FIG. 1 and is a cross-sectional view illustrating three adjacent pixels provided in the display panel illustrated in FIG. 1.

Referring to FIG. 8 in conjunction with FIGS. 1 to 4, a display apparatus according to an aspect of the present disclosure may include a substrate 110, a buffer layer 111, a plurality of pixel driving chips 120, a first planarization layer 113, a line layer, a second planarization layer 115, a light emission part ELP, and an encapsulation layer 117.

The substrate 110, a pixel array substrate, may be formed of an insulating material such as glass, quartz, ceramic, or plastic. The substrate 110 may include a plurality of pixel areas PA each including a light emitting area EA and a circuit area CA.

The buffer layer 111 may be provided on the substrate 110. The buffer layer 111 may prevent water from penetrating into the light emission part ELP through the substrate 110. According to an aspect, the buffer layer 111 may include at least one inorganic layer including an inorganic material. For example, the buffer layer 111 may be a multilayer where one or more inorganic layers of silicon oxide ($SiO_x$), silicon nitride ($SiN_x$), silicon oxynitride (SiON), titanium oxide ($TiO_x$), and aluminum oxide ($AlO_x$) are alternately stacked.

The plurality of pixel driving chips 120 may be mounted on the buffer layer 111 in the circuit area CA of the plurality of pixel areas PA through a chip mounting (or transfer) process. The plurality of pixel driving chips 120 may each have a size of 1 μm to 100 μm, but are not limited thereto. In other aspects, the plurality of pixel driving chips 120 may each have a size which is smaller than that of the light emitting area EA other than an area occupied by the circuit area CA among the plurality of pixel areas PA. Each of the plurality of pixel driving chips 120, as described above, has the same configuration as that of the pixel driving chip illustrated in one of FIG. 4, and thus, its overlapping description will be omitted.

The plurality of pixel driving chips 120 may be attached on the buffer layer 111 by means of an adhesive layer. The adhesive layer may be provided on a rear surface (or a back surface) of each of the plurality of pixel driving chips 120. In this case, in the chip mounting process, a vacuum adsorption nozzle may vacuum-adsorb the plurality of pixel driving chips 120 each including the rear surface (or the back surface) coated with the adhesive layer, and thus, the plurality of pixel driving chips 120 may be mounted on (or transferred onto) the buffer layer 111 in a corresponding pixel PA. Meanwhile, the plurality of pixel driving chips 120 may be attached to an adhesive layer provided on the entire upper surface of the buffer layer 111.

Optionally, the plurality of pixel driving chips 120 may be respectively mounted on a plurality of concave portions 112 respectively provided in the circuit areas CA of the plurality of pixel areas PA.

Each of the plurality concave portions 112 may be recessed from a front surface of the buffer layer 111 disposed in a corresponding circuit area CA. For example, each of the plurality of concave portions 112 may have a groove shape or a cup shape which has a certain depth from the front surface of the buffer layer 111. Each of the plurality of concave portions 112 may individually accommodate and fix a corresponding pixel driving chip of the plurality of pixel driving chips 120, thereby minimizing an increase in thickness of the display apparatus caused by a thickness (or a height) of each of the plurality of pixel driving chips 120. Each of the plurality of concave portions 112 may be concavely formed to have a shape corresponding to the plurality of pixel driving chips 120 and to have an inclined surface inclined at a certain angle, and thus, misalignment between the circuit areas CA and the pixel driving chips 120 is minimized in a mount process of mounting the plurality of pixel driving chips 120 on the buffer layer 111.

The plurality of pixel driving chips 120 according to an aspect may be respectively attached on floors of the plurality of concave portions 112 by the adhesive layer coated on each of the plurality of concave portions 112. According to another aspect, the plurality of pixel driving chips 120 may be respectively attached on the floors of the plurality of concave portions 112 by the adhesive layer coated on a whole surface of the buffer layer 111 including the plurality of concave portions 112.

The first planarization layer 113 may be disposed on a front surface of the substrate 110 and may cover the plurality of pixel driving chips 120. That is, the first planarization layer 113 may cover the buffer layer 111 and the plurality of pixel driving chips 120 disposed on the substrate 110, and thus, may provide a flat surface on the buffer layer 111 and the plurality of pixel driving chips 120 and may fix the plurality of pixel driving chips 120. For example, the first planarization layer 113 may be formed of acryl resin, epoxy resin, phenolic resin, polyamide resin, polyimide resin, and/or the like.

The line layer may include a plurality of first metal lines ML1, an insulation layer 114, and a plurality of second metal lines ML2.

The first metal lines ML1 may be disposed on the first planarization layer 113 to pass through the display area DA in a first direction X or a second direction Y. Each of the first metal lines ML1 may be used as one of a pixel data transfer line, a clock transfer line, a pixel driving power line, and a cathode power line, or may be used as a bridge line for diverting one of lines which intersect one another on the same layer. For example, the first metal lines ML1 may be used as the bridge line and the touch routing line. The first metal line ML1 may be electrically connected to a bump of a corresponding pixel driving chip 120 through a first chip contact hole CH1 provided in the first planarization layer 113.

The insulation layer 114 may be disposed on the substrate 110 to cover the first metal lines ML1. For example, the insulation layer 114 may be $SiO_x$, $SiN_x$, SiON, or a multilayer thereof.

The second metal lines ML2 may be disposed on the insulation layer 114 to pass through the display area DA. The second metal lines ML2 may be used as lines, other than lines corresponding to the first metal lines ML1, of a pixel data transfer line, a clock transfer line, and a pixel driving power line PPL. For example, the clock transfer line corresponding to the second metal line ML2 may extend or protrude to the circuit area CA of each pixel area PA and may be electrically connected to a second bump B2 of a corresponding pixel driving chip 120 through a second chip contact hole CH2 provided in the insulation layer 114 and the first planarization layer 113 to supply a reference clock to the second bump B2 of the corresponding pixel driving chip 120. Also, the pixel driving power line PPL corresponding to the second metal line ML2 may extend or protrude to the circuit area CA of each pixel area PA and may be electrically connected to a fifth bump B5 of a corresponding pixel driving chip 120 through a third chip contact hole provided in the insulation layer 114 and the first planarization layer 113 to supply a pixel driving voltage Vdd to a fifth bump B5 of the corresponding pixel driving chip 120. In this case, the third chip contact hole may be formed along with the second chip contact hole CH2.

The first metal lines ML1 and the second metal lines ML2 may be formed of molybdenum (Mo), aluminum (Al), silver (Ag), chrome (Cr), gold (Au), titanium (Ti), nickel (Ni), neodymium (Nd), copper (Cu), or an alloy thereof and may be formed of a single layer including at least one of the metals or the alloy or a multilayer which includes two or more layers and includes at least one of the metals or the alloy.

The second planarization layer 115 may be disposed on the substrate 110 to cover the line layer. That is, the second planarization layer 115 may be provided on the substrate 110 to cover the second metal lines ML2 and the insulation layer 114 and may provide a flat surface on the second metal lines ML2 and the insulation layer 114. For example, the second planarization layer 115 may be formed of acryl resin, epoxy resin, phenolic resin, polyamide resin, polyimide resin, and/or the like, but is not limited thereto.

The light emission part ELP may include a plurality of anode electrodes AE, a bank layer BL, a light emitting layer EL, and a cathode electrode CE.

Each of the plurality of anode electrode AE is individually patterned in each of the pixel areas PA. Each of the plurality of anode electrodes AE may be electrically connected to a sixth bump B6 of a corresponding pixel driving chip 120 through an anode contact hole CH3 provided in the second planarization layer 115 in a corresponding pixel area PA and may be supplied with a data current through the sixth bump B6 of the corresponding pixel driving chip 120. According to an aspect, the plurality of anode electrodes AE may include a metal material which is high in reflectance. For example, each of the plurality of anode electrodes AE may be formed in a multilayer structure such as a stacked structure (Ti/Al/Ti) including aluminum (Al) and titanium (Ti), a stacked structure (ITO/Al/ITO) including aluminum (Al) and indium tin oxide (ITO), an APC (Al/Pd/Cu) alloy of Al, palladium (Pd), and Cu, or a stacked structure (ITO/APC/ITO) including an APC alloy and ITO, or may include a single-layer structure including one material or an alloy of two or more materials selected from among silver (Ag), aluminum (Al), molybdenum (Mo), gold (Au), magnesium (Mg), calcium (Ca), and barium (Ba).

The bank layer BL may define the light emitting area EA in each of the plurality of pixel areas PA and may be referred to as a pixel defining layer (or an isolation layer). The bank layer BL may be provided on the second planarization layer 115 and in an edge of each of the plurality of anode electrodes AE and may overlap the circuit area CA of the pixel area PA to define the light emitting area EA in each pixel area PA. For example, the bank layer BL may be formed of one organic material of acryl resin, epoxy resin, phenolic resin, polyamide resin, polyimide resin, benzocyclobutene resin, and fluorine resin. As another example, the bank layer BL may be formed of a photosensitive material including a black pigment. In this case, the bank layer BL may act as a light blocking pattern.

The light emitting layer EL may be disposed in the light emitting area EA on the plurality of anode electrodes AE.

The light emitting layer EL according to an aspect may include two or more sub-light emitting layers for emitting white light. For example, the light emitting layer EL may include a first sub-light emitting layer and a second sub-light emitting layer for emitting white light based on a combination of first light and second light. In this case, the first sub-light emitting layer may emit the first light and may include one of a blue light emitting layer, a green light emitting layer, a red light emitting layer, a yellow light emitting layer, and a yellow-green light emitting layer. The second sub-light emitting layer may include a light emitting layer, which emits light having a complementary color relationship with the first light, of a blue light emitting layer, a green light emitting layer, a red light emitting layer, a yellow light emitting layer, and a yellow-green light emitting layer. Since the light emitting layer EL emits white light, the light emitting layer EL may be provided on the substrate 110 to cover the plurality of anode electrodes AE and the bank layer BL without being individually patterned in each pixel area PA.

Additionally, the light emitting layer EL may additionally include one or more function layers for enhancing the emission efficiency and/or lifetime of the light emitting layer EL.

The cathode electrode CE may be disposed to cover the light emitting layer EL. In order for light emitted from the light emitting layer EL to be irradiated onto the opposite substrate 190, the cathode electrode CE according to an aspect may be formed of indium tin oxide (ITO) or indium zinc oxide (IZO), which is a transparent conductive material such as transparent conductive oxide (TCO).

The encapsulation layer 117 may be disposed on the substrate 110 to cover the light emission part ELP. The encapsulation layer 117 according to an aspect may prevent oxygen or water from penetrating into the light emitting layer EL of the light emission part ELP. According to an aspect, the encapsulation layer 117 may include one inorganic material of silicon oxide ($SiO_x$), silicon nitride ($SiN_x$), silicon oxynitride (SiON), titanium oxide ($TiO_x$), and aluminum oxide ($AlO_x$).

Optionally, the encapsulation layer 117 may further include at least one organic layer. The organic layer may be formed to have a sufficient thickness, for preventing particles from penetrating into a light emitting device layer via the encapsulation layer 117. According to an aspect, the organic layer may be formed of one organic material of acryl resin, epoxy resin, phenolic resin, polyamide resin, polyimide resin, benzocyclobutene resin, and fluorine resin.

According to an aspect of the present disclosure, the substrate 110 may further include a plurality of cathode power lines which are disposed in parallel on the insulation layer 114 with at least one pixel driving line groups LG1 to LGm therebetween to pass through the display area DA.

Figure 9:
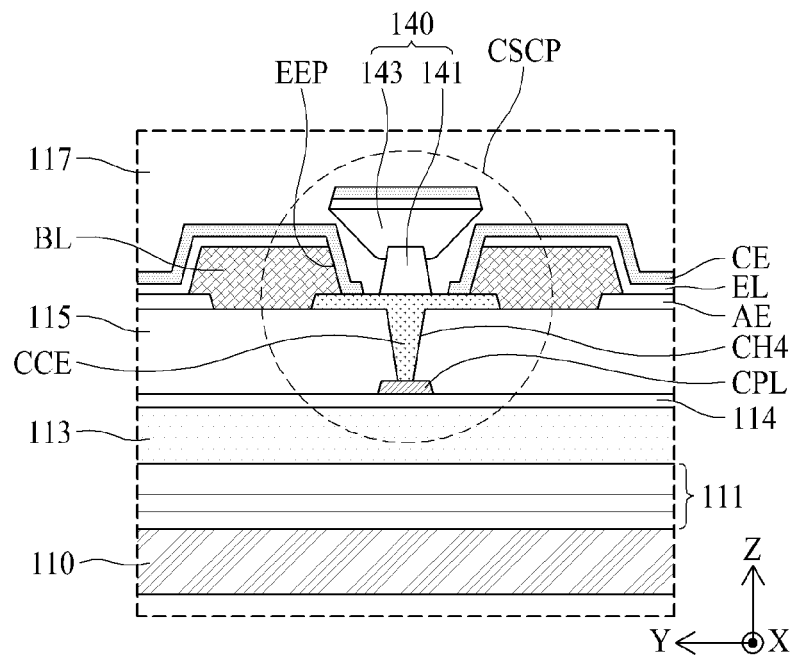
FIG. 9 is a cross-sectional view illustrating a connection structure between a cathode electrode and a cathode power supply line according to an aspect of the present disclosure.

The plurality of cathode power lines may receive a cathode voltage (for example, a ground voltage) from the power management circuit 600 through the pad part PP. The plurality of cathode power lines may be selected from among the second metal lines ML2 or the first metal lines ML1. That is, some of the second metal lines ML2 may be used as a plurality of cathode power lines. The plurality of cathode power lines may be electrically connected to the cathode electrode CE in the display area DA. To this end, as shown in FIG. 9, the bank layer BL may include a plurality of cathode sub-contact parts CSCP which are electrically connected to a plurality of cathode power lines CPL and a cathode electrode CE.

The plurality of cathode sub-contact part CSCP may include a plurality of cathode connection electrodes CCE and a plurality of electrode exposure parts EEP.

The plurality of cathode connection electrodes CCE may be provided in an island shape on the second planarization layer 115 overlapping the bank layer BL and may be formed of the same material along with the anode electrode AE. An edge, other than a center, of each of the cathode connection electrodes CCE may be surrounded by the bank layer BL and may be spaced apart from and electrically disconnected from an adjacent anode electrode AE. Each of the cathode connection electrodes may be electrically connected to a corresponding cathode power line CPL through a cathode contact hole CH4 provided in the second planarization layer 115. In this case, one cathode power line CPL may be electrically connected to at least one cathode connection electrode CCE through at least one cathode contact hole CH4.

The plurality of electrode exposure parts EEP may be disposed on the bank layer BL overlapping the plurality of cathode connection electrodes CCE and may respectively expose the plurality of cathode connection electrodes CCE. Thus, the cathode electrode CE may be electrically connected to each of the plurality of cathode connection electrodes CCE respectively exposed through the plurality of electrode exposure parts EEP and may be electrically connected to each of the plurality of cathode power lines CPL through the plurality of cathode connection electrodes CCE, and thus, may have a relatively low resistance. In particular, the cathode electrode CE may receive the cathode voltage from each of the plurality of cathode power lines CPL through the plurality of cathode connection electrodes CCE, thereby preventing non-uniform luminance caused by the voltage drop (IR drop) of the cathode voltage supplied to the cathode electrode CE.

In addition, according to an aspect of the present disclosure, the substrate 110 may further include a partition wall part 140.

The partition wall part 140 may include a partition wall supporting part 141 disposed in each of the plurality of cathode connection electrodes CCE and a partition wall 143 disposed on the partition wall supporting part 141.

The partition wall supporting part 141 may be formed in the center of each of the plurality of cathode connection electrodes CCE to have a tapered structure having a trapezoidal cross-sectional surface.

The partition wall 143 may be provided on the partition wall supporting part 141 to have a reverse-tapered structure where a width of a lower surface is narrower than that of an upper surface, and may hide a corresponding electrode exposure part EEP. For example, the partition wall 143 may include a lower surface having a first width supported by the partition wall supporting part 141, an upper surface having a second width which is greater than the first width and is greater than or equal to a width of the electrode exposure part EEP, and an inclined surface which is disposed between the lower surface and the upper surface to hide the electrode exposure part EEP. The upper surface of the partition wall 143 may be provided to cover the electrode exposure part EEP and to one-dimensionally have a size which is greater than or equal to that of the electrode exposure part EEP, and thus, a light emitting material may be prevented from penetrating into the cathode connection electrode CCE exposed at the electrode exposure part EEP in a process of depositing the light emitting layer EL, whereby a cathode electrode material may be electrically connected to the cathode connection electrode CCE exposed at the electrode exposure part EEP in the process of depositing the light emitting layer EL. A penetration space (or a void) may be provided between the inclined surface of the partition wall 143 and the cathode connection electrode CCE exposed at the electrode exposure part EEP, and the edge of the cathode electrode CE may be electrically connected to the cathode connection electrode CCE exposed at the electrode exposure part EEP through the penetration space.

Referring again to FIG. 8 in conjunction with FIGS. 1 to 4, the opposite substrate 190 may be defined as a color filter array substrate. The opposite substrate 190 according to an aspect may include a barrier layer 191, a black matrix 193, and a color filter layer 195.

The barrier layer 191 may be provided one whole surface of the opposite substrate 190 facing the substrate 110 and may prevent penetration of external water or moisture. The barrier layer 191 according to an aspect may include at least one inorganic layer including an inorganic material. For example, the barrier layer 191 may be formed of a multilayer where one or more inorganic layers of silicon oxide ($SiO_x$), silicon nitride ($SiN_x$), silicon oxynitride (SiON), titanium oxide ($TiO_x$), and aluminum oxide ($AlO_x$) are alternately stacked.

The black matrix 193 may be disposed on the barrier layer 191 to overlap the bank layer BL provided on the substrate 110 and may define a plurality of transmissive parts respectively overlapping the emission areas EA of the plurality of pixel areas PA. The black matrix 193 may be formed of a resin material or an opaque metal material such as chrome Cr or CrO$_x$, or may be formed of a light absorbing material.

The color filter layer 195 may be disposed in each of the plurality of transmissive parts provided by the black matrix 193. The color filter layer 195 may include one of a red color filter, a green color filter, and a blue color filter. The red color filter, the green color filter, and the blue color filter may be repeatedly disposed in the first direction X.

Optionally, the color filter layer 195 may include a quantum dot which has a size enabling light of a predetermined color to be emitted and re-emits light according to light incident from the light emitting layer EL. In this case, the quantum dot may be selected from among CdS, CdSe, CdTe, CdZnSeS, ZnS, ZnSe, GaAs, GaP, GaAs—P, Ga—Sb, InAs, InP, InSb, AlAs, AlP, AlSb, and the like. For example, the red color filter may include a quantum dot of CdSe or InP emitting red light, the green color filter may include a quantum dot of CdZnSeS emitting green light, and the blue color filter may include a quantum dot of ZnSe emitting blue light. As described above, when the color filter layer 195 includes a quantum point, a color reproduction rate increases.

The opposite substrate 190 may be opposite-bonded to the substrate 110 by the transparent adhesive layer 150.

The transparent adhesive layer 150 may be referred to as a filler. The transparent adhesive layer 150 according to an aspect may be formed of a material capable of being filling between the substrate 110 and the opposite substrate 190, and for example, may be formed of a transparent epoxy material capable of transmitting light, but the present disclosure is not limited thereto. The transparent adhesive layer 150 may be formed on the substrate 110 by a process such as an inkjet process, a slit coating process, or a screen printing process, but is not limited thereto. In other aspects, the transparent adhesive layer 150 may be provided on the opposite substrate 190.

Additionally, the display apparatus according to an aspect of the present disclosure may further include a dam pattern 170 which surrounds an outer portion of the transparent adhesive layer 150.

The dam pattern 170 may be provided in an edge of the opposite substrate 190 in a closed loop form. The dam pattern 170 according to an aspect may be provided in an edge of the barrier layer 191 provided on the opposite substrate 190 to have a certain height. The dam pattern 170 may block the spread or overflow of the transparent adhesive layer 150 and may bond the substrate 110 to the opposite substrate 190. The dam pattern 170 according to an aspect may be formed of a high-viscosity resin (for example, an epoxy material) capable of being cured by light such as ultraviolet (UV). Furthermore, the dam pattern 170 may be formed of an epoxy material including a getter material capable of adsorbing water and/or oxygen, but is not limited thereto. The dam pattern 170 may block penetration of external water and/or oxygen into a gap between the substrate 110 and the opposite substrate 190 bonded to each other to protect the light emitting layer EL from the external water and/or oxygen, thereby increasing the reliability of the light emitting layer EL and preventing the lifetime of the light emitting layer EL from being reduced by the water and/or oxygen.

Figure 10:
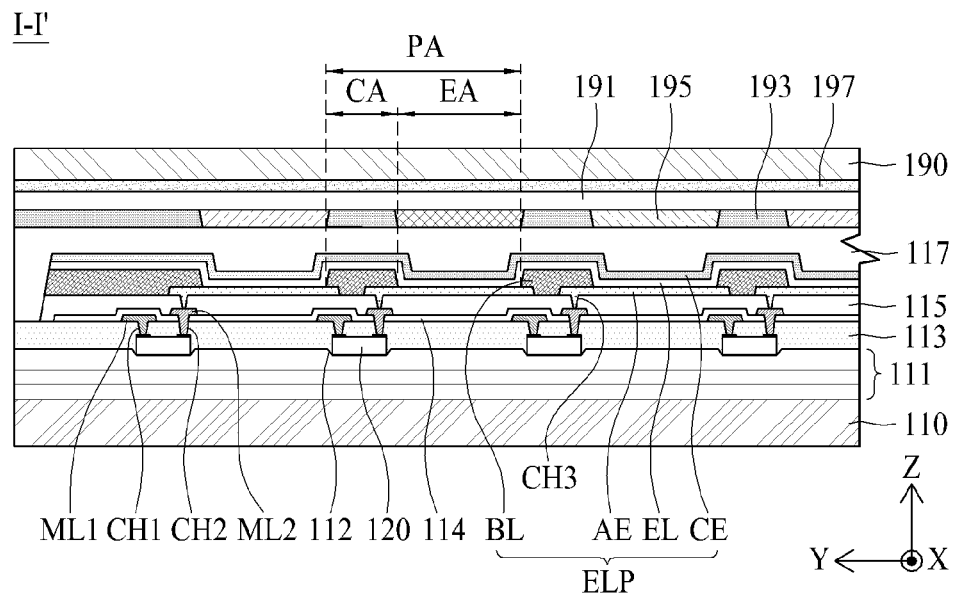
FIG. 10 is another cross-sectional view taken along line I-I' illustrated in FIG. 1.

The barrier layer 191, the black matrix 193, and the color filter layer 195 shown in FIG. 8 may be disposed on the encapsulation layer 117 of the substrate 110 as shown in FIG. 10, instead of the opposite substrate 190.

Referring to FIG. 10, the barrier layer 191, the black matrix 193, and the color filter layer 195 may be disposed on a front surface of the encapsulation layer 117.

The black matrix 193 may be directly provided on the front surface of the encapsulation layer 117 to overlap the bank layer BL provided on the substrate 110 and may define the plurality of transmissive parts respectively overlapping the light emitting areas EA of the plurality of pixel areas PA.

The color filter layer 195 may be disposed on the front surface of the encapsulation layer 117 exposed by each of the plurality of transmissive parts defined by the black matrix 193. Except for that the color filter layer 195 is provided on the encapsulation layer 117, the color filter layer 195 is the same as described above, and thus, a repetitive description thereof will be omitted.

The barrier layer 191 according to an aspect may be provided on the front surface of the encapsulation layer 117 to cover the color filter layer 195 and the black matrix 193 and may provide a flat surface on the black matrix 193 and the color filter layer 195. In this case, in a case where the barrier layer 191 is formed through a high-temperature process, the light emitting layer EL and/or the like disposed on the substrate 110 may be damaged by a high temperature. Thus, the barrier layer 191 may be formed of an organic material such as an acryl-based, epoxy-based, or siloxane-based organic insulating material capable of being processed at a low temperature of 100° C. or less, in order to prevent the damage of the light emitting layer EL vulnerable to a high temperature.

The opposite substrate 190 may be attached on a front surface of the barrier layer 191 by an optical adhesive member 197 instead of the transparent adhesive layer 150. In this case, the optical adhesive member 197 may be an optically clear adhesive (OCA), an optically clear resin (OCR), or a pressure sensitive adhesive (PSA).

Since the opposite substrate 190 is attached to the front surface of the barrier layer 191 by the optical adhesive member 197, the above-described dam pattern 170 may be omitted.

Figure 11:
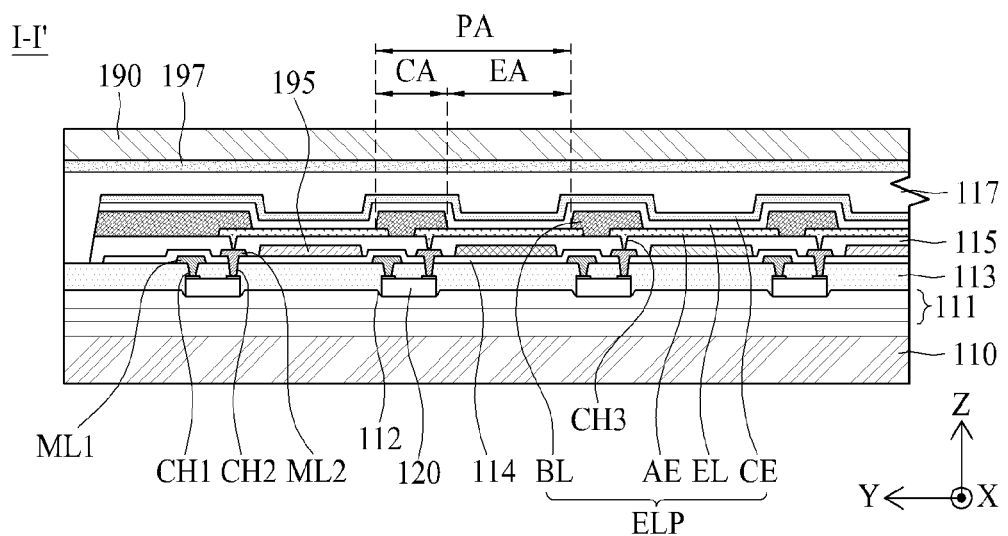
FIG. 11 is another cross-sectional view taken along line I-I' illustrated in FIG. 1.

Moreover, as shown in FIG. 11, the color filter layer 195 may be disposed between the anode electrode AE and the substrate 110 to overlap the light emitting area EA of each pixel area PA. For example, the color filter layer 195 may be disposed on the buffer layer 111 or the second planarization layer 115 overlapping the light emitting area EA of each pixel area PA. In this case, the anode electrode AE may be formed of a transparent conductive material, and the cathode electrode CE may be formed of a metal material which is high in reflectance, whereby light emitted from the light emitting layer EL may sequentially pass through the color filter layer 195 and the substrate 110 and may be output to the outside.

As described above, in an aspect of the present disclosure, each of the gate driving circuit and the data driving pixel for driving each pixel of the display panel may be implemented as a microchip mounted on a substrate, and thus, a process of forming at least one TFT for each pixel of a general display panel is not needed. Also, since a transistor is not disposed on the substrate of the display panel, image quality is prevented from being degraded due to non-uniform luminance caused by a threshold voltage deviation of driving transistors occurring between pixels. Also, in an aspect of the present disclosure, a light emission part may emit light, based on a reference clock and digital pixel data, and thus, a plurality of gate lines for sequentially selecting a plurality of pixels and a gate driving circuit for driving the plurality of pixels may be removed (or omitted) from a substrate, thereby simplifying a configuration of the display apparatus. Accordingly, since the grate driving circuit is removed from the substrate, a bezel width of the display apparatus is maximally reduced.

Figure 12:
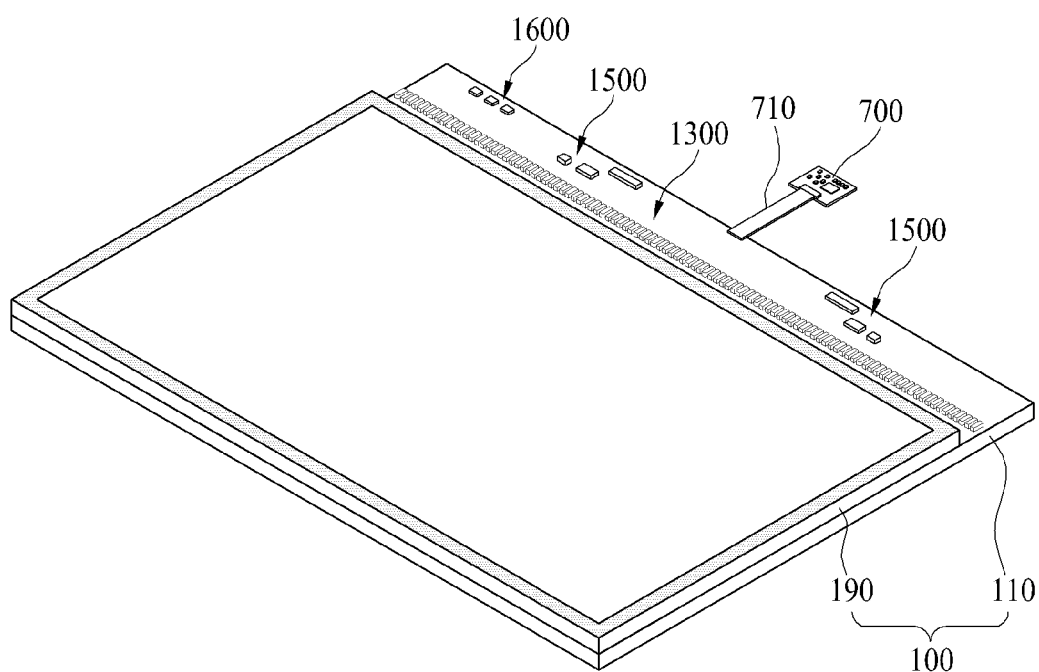
FIG. 12 is a diagram illustrating a display apparatus according to another aspect of the present disclosure.
Figure 13:
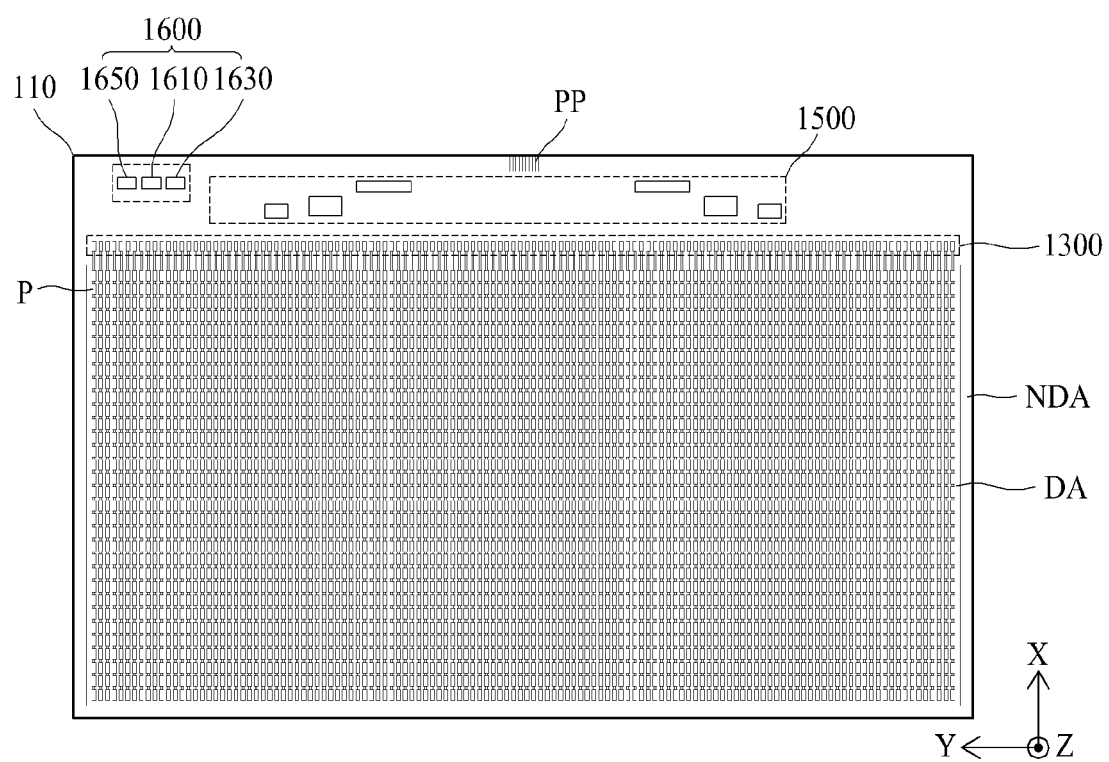
FIG. 13 is a diagram illustrating a substrate illustrated in FIG. 12.

FIG. 12 is a diagram illustrating a display apparatus according to another aspect of the present disclosure. FIG. 13 is a diagram illustrating a substrate illustrated in FIG. 12 and illustrates an example where each of the timing controller and the power management circuit of the display apparatus illustrated in FIGS. 1 to 11 is implemented as a microchip, and the microchip is mounted on a substrate of a display panel.

Referring to FIGS. 12 and 13, the display apparatus according to another aspect of the present disclosure may include a display panel 100, a data driving chip array part 1300, a timing controller chip array part 1500, and a power management chip array part 1600.

The display panel 100 may include a substrate 110 and an opposite substrate 190 and is the same as the display panel of the display apparatus according to an aspect of the present disclosure illustrated in FIGS. 1 to 11. Thus, like reference numerals refer to like elements, and a repetitive description thereof will be omitted.

The timing controller chip array part 1500 may be provided in a first non-display area to generate a digital data signal, based on an image signal (or a differential signal) supplied from a display driving system 700 through a pad part PP and may provide the digital data signal to the data driving chip array part 1300. That is, the timing controller chip array part 1500 may receive the differential signal input through the pad part PP to generate frame-based digital pixel data, a dot clock, a reference clock, and a data start signal from the differential signal. Also, the timing controller chip array part 1500 may perform image processing for image quality improvement on the digital data signal in units of frames, segment the frame-based digital data signal in units of at least one horizontal line, and provide a plurality of segmented digital data signals to the data driving chip array part 1300.

The data driving chip array part 1300 may be provided in the first non-display area (or an upper non-display area) of the substrate 110. Also the data driving chip array part 1300 may receive the digital pixel data, the reference clock, and the data start signal supplied from the timing controller chip array part 1500 and align the digital pixel data, based on the reference clock and the data start signal. Also, the data driving chip array part 1300 may output the aligned digital pixel data to a first pixel data transfer line of each of first to $m^{th}$ pixel driving line groups according to the serial interface manner and may output the reference clock to a first clock transfer line of each of the first to $m^{th}$ pixel driving line groups.

The power management chip array part 1600 may be provided in the non-display area of the substrate 110 and may output various kinds of voltages for displaying an image to each pixel P of the display panel 100, based on an input power supplied from the display driving system 700 through the pad part PP disposed in the substrate 110. According to an aspect, the power management chip array part 1600 may generate a transistor logic voltage, a pixel driving voltage, and a cathode voltage, based on the input power.

The power management chip array part 1600 according to an aspect may include a DC-DC converter chip array part which is provided in the non-display area NDA of the substrate 110 and performs dc-dc conversion on the input power received from the outside to output the converted input power.

The DC-DC converter chip array part may include a logic power chip 1610 and a driving power chip 1630. In this case, the logic power chip 1610 and the driving power chip 1630 may be a minimum-unit microchip or one chipset and may be a semiconductor packaging device which includes an IC including transistors and has a fine size.

The logic power chip 1610 may generate a transistor logic voltage, based on the input power and may provide the transistor logic voltage to a microchip that requires the transistor logic voltage. For example, the logic power chip 1610 may decrease (step down) the input power to generate the transistor logic voltage of 3.3V. Also, the logic power chip 1610 may generate a ground voltage, based on the input power and may provide the ground voltage to a microchip that requires the ground voltage. In this case, the ground voltage may be used as the cathode voltage supplied to a cathode electrode disposed in the display panel 100. According to an aspect, the logic power chip 1610 may be a DC-DC converter (for example, a step-down converter chip or a buck converter chip), but is not limited thereto.

The driving power chip 1630 may generate the pixel driving voltage, based on the input power and may provide the pixel driving voltage to each pixel P and a microchip that require the pixel driving voltage. For example, the driving power chip 1630 may generate the pixel driving voltage of 12V. According to an aspect, the driving power chip 1630 may be a DC-DC converter (for example, a step-up converter chip or a boost converter chip), but is not limited thereto.

The power management chip array part 1600 according to this example may further include a serial communication chip 1650. In this case, the serial communication chip 1650 may be a minimum-unit microchip or one chipset and may be a semiconductor packaging device which includes an IC including transistors and has a fine size.

The serial communication chip 1650 may be connected to the display driving system 700 through a connector attached on a serial communication pad disposed at one non-display area of the substrate 110, separately from the pad part PP disposed on the substrate 110. The serial communication chip 1650 may receive a voltage tuning signal supplied from the display driving system 700, may restore the received voltage tuning signal to voltage tuning data, and may transfer the voltage tuning data to the logic power chip 1610 and the driving power chip 1630, thereby allowing a voltage level of at least one of the logic voltage, the pixel driving voltage, and the cathode voltage to be tuned based on the voltage tuning data.

Figure 14:
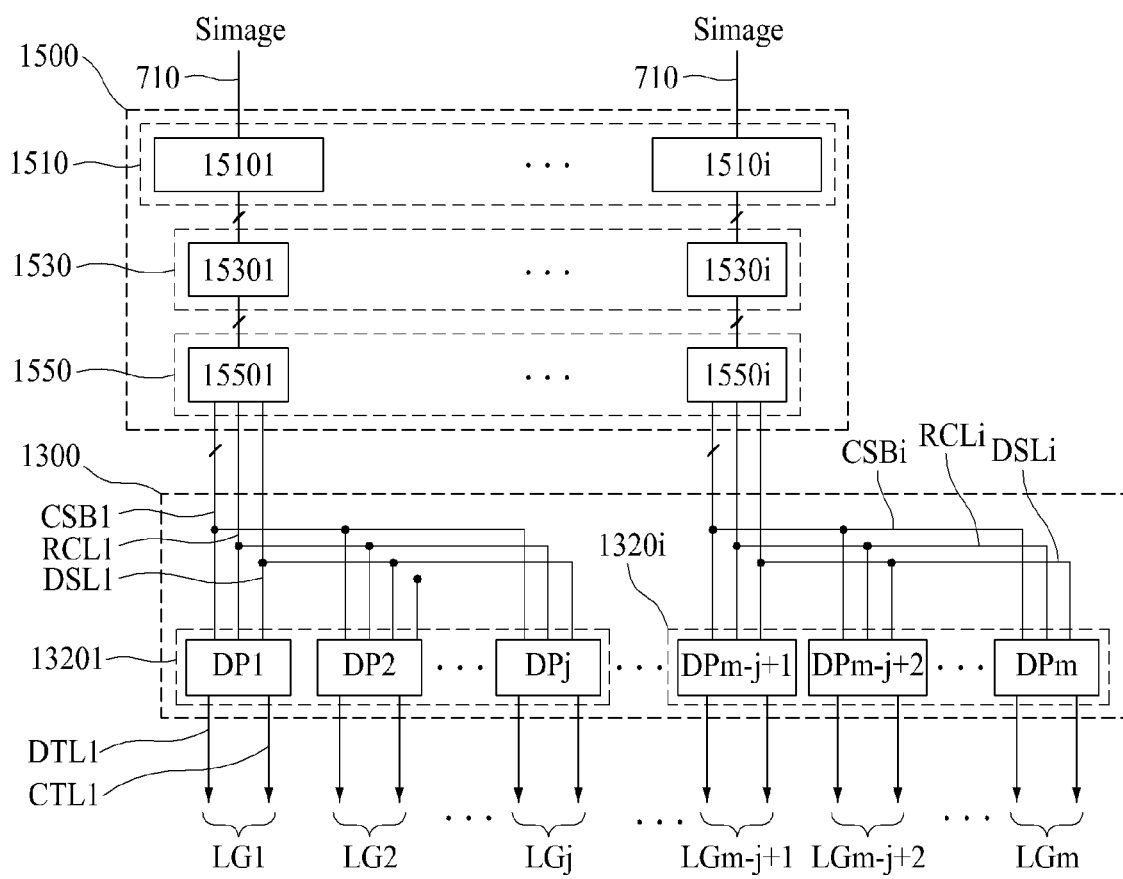
FIG. 14 is a diagram illustrating a timing controller chip array part and a data driving chip array part illustrated in FIGS. 12 and 13.

FIG. 14 is a diagram illustrating a timing controller chip array part and a data driving chip array part illustrated in FIGS. 12 and 13.

Referring to FIGS. 12 to 14, the timing controller chip array part 1500 of the display apparatus according to the present aspect may include an image signal receiving chip array 1510, an image quality improvement chip array 1530, and a data control chip array 1550.

The image signal receiving chip array 1510 may receive an image signal Simage input from the display driving system 700 through the pad part PP and may output the digital pixel data in units of at least one horizontal line. The image signal receiving chip array 1510 may receive the digital data signal based on the differential signal from the display driving system 700 according to the high serial interface manner, generate digital pixel data corresponding to at least one horizontal line, based on the received digital data signal, and generate the reference clock and the data start signal from the differential signal. In this case, the image signal Simage may be transferred from the display driving system 700 to the image signal receiving chip array 1510 according to the high speed serial interface manner (for example, the V-by-one interface manner).

According to an aspect, the image signal receiving chip array 1510 may include first to $i^{th}$ image signal receiving chips 15101 to 1510i. In this case, each of the first to $i^{th}$ image signal receiving chips 15101 to 1510i may be a minimum-unit microchip or one chipset and may be a semiconductor packaging device which includes an IC including transistors and has a fine size.

In order to perform synchronization and data communication between the first to $i^{th}$ image signal receiving chips 15101 to 1510i, the first image signal receiving chip 15101 may be programmed as a master to control overall operations and functions in the image signal receiving chip array 1510, and each of the second to $i^{th}$ image signal receiving chips 15102 to 1510i may be programmed as a slave to operate in synchronization with the first image signal receiving chip 15101.

Each of the first to $i^{th}$ image signal receiving chips 15101 to 1510i individually receives digital data signals to be supplied to j pixels among differential signals for the image signal Simage transferred from the display driving system 700 through an interface cable 710, individually generates pixel data to be supplied to the j pixels on the basis of the received digital data signals, and individually generates a reference clock and a data start signal from the differential signals for the image signal Simage. For example, when the interface cable 710 has first to $i^{th}$ lanes, the first image signal receiving chip 15101 may individually receive digital data signals corresponding to first to $i^{th}$ pixels from the differential signals for the image signal Simage transferred from the display driving system 700 through the first lane of the interface cable 710, may individually generate pixel data corresponding to the first to $j^{th}$ pixels on the basis of the received digital data signals, and may individually generate a reference clock and a data start signal from the differential signals for the image signal Simage. Also, the $i^{th}$ image signal receiving chip 1510i may individually receive digital data signals corresponding to m−j+$1^{th}$ to $m^{th}$ pixels from the differential signals for the image signal Simage transferred from the display driving system 700 through the $i^{th}$ lane of the interface cable 710, may individually generate pixel data corresponding to the m−j+$1^{th}$ to $m^{th}$ pixels on the basis of the received digital data signals, and may individually generate a reference clock and a data start signal from the differential signals for the image signal Simage.

Each of the first to $i^{th}$ image signal receiving chips 15101 to 1510i may generate display setting data for the timing controller chip array part 1500 from a differential signal of a first frame input through the interface cable 710, may store the display setting data in an internal memory, and may generate a digital data signal, a reference clock, and a data start signal from differential signals for frames that are sequentially input through the interface cable 710.

According to an aspect, the image signal receiving chip array 1510 may be configured with only one image signal receiving chip. That is, the first to $i^{th}$ image signal receiving chips 15101 to 1510i may be integrated into a single integrated image signal receiving chip.

The image quality improvement chip array 1530 may receive a frame-based digital data signal from the image signal receiving chip array 1510 and may execute a predetermined image quality improvement algorithm to improve the quality of an image corresponding to the frame-based digital data signal.

According to an aspect, the image quality improvement chip array 1530 may include first to $i^{th}$ image quality improvement chips 15301 to 1530i respectively connected to the first to $i^{th}$ image signal receiving chips 15101 to 1510i. The first to $i^{th}$ image quality improvement chips 15301 to 1530i may receive digital data signals from the image signal receiving chips 15101 to 1510i and may execute the predetermined image quality improvement algorithm to improve image quality according to the frame-based digital data signal. In this case, each of the first to $i^{th}$ image quality improvement chips 15301 to 1530i may be a minimum-unit microchip or one chipset and may be a semiconductor packaging device which includes an IC including transistors and has a fine size.

In order to perform synchronization and data communication between the first to $i^{th}$ image quality improvement chips 15301 to 1530i, the first image quality improvement chip 15301 may be programmed as a master to control overall operations and functions in the image quality improvement chip array 1530, and each of the second to $i^{th}$ image quality improvement chips 15302 to 1530i may be programmed as a slave to operate in synchronization with the first image quality improvement chip 15301.

When the image signal receiving chip array 1510 is configured as a single integrated data receiving chip, the first to $i^{th}$ image quality improvement chips 15301 to 1530i may be integrated into a single integrated image quality improvement chip connected to the integrated data receiving chip.

Based on the reference clock and the data start signal provided from the image signal receiving chip array 1510, the data control chip array 1550 may align and output digital pixel data with image quality improved by the image quality improvement chip array 1530 in units of one horizontal line.

The data control chip array 1550 according to an aspect may include first to $i^{th}$ data control chips 15501 to 1550i respectively connected to the first to $i^{th}$ image quality improvement chips 15301 to 1530i. The first to $i^{th}$ data control chips 15501 to 1550i may receive the digital pixel data with improved image quality from the image quality improvement chips 15301 to 1530i and may align and output the digital data signal according to the reference clock and the data start signal provided from the image signal receiving chip array 1510. In this case, each of the first to $i^{th}$ data control chips 15501 to 1550i may be a minimum-unit microchip or one chipset and may be a semiconductor packaging device which includes an IC including transistors and has a fine size.

In order to perform synchronization and data communication between the first to $i^{th}$ data control chips 15501 to 1550i, the first data control chip 15501 may be programmed as a master to control overall operations and functions in the data control chip array 1550, and each of the second to $i^{th}$ data control chips 15502 to 1550i may be programmed as a slave to operate in synchronization with the first data control chip 15501.

The first to $i^{th}$ data control chips 15501 to 1550i may individually output digital pixel data according to the serial data communication manner using first to $i^{th}$ common serial data buses CSB1 to CSBi each having a data bus corresponding to the number of bits of the digital pixel data, individually output the reference clock to first to $i^{th}$ common reference clock lines RCL1 to RCLi, and individually output the data start signal to first to $i^{th}$ data start signal lines DSL1 to DSLi. For example, the first image signal receiving chip

15101 may transfer corresponding digital pixel data, a corresponding reference clock, and a corresponding data start signal through the first common serial data bus CSB1, the first common reference clock line RCL1, and the first data start signal line DSL1. Also, the $i^{th}$ image signal receiving chip 1510i may transfer corresponding digital pixel data, a corresponding reference clock, and a corresponding data start signal through the $i^{th}$ common serial data bus CSBi, the $i^{th}$ common reference clock line RCLi, and the $i^{th}$ data start signal line DSLi.

When the image signal receiving chip array 1510 is configured as a single integrated data receiving chip and the image quality improvement chip array 1530 is configured as a single integrated image quality improvement chip, the first to $i^{th}$ data control chips 15501 to 1550i may be integrated into a single integrated data control chip connected to the integrated data receiving chip.

As described above, the timing controller chip array part 1500 may be mounted on the substrate 110 of the display panel 100 and may be connected to the display driving system 700 through one interface cable 710, thereby simplifying a connection structure between the display panel 100 and the display driving system 700.

The data driving chip array part 1300 of the display apparatus according to an aspect of the present disclosure may include first to $m^{th}$ data processing circuits DP1 to DPm.

Each of the first to $m^{th}$ data processing circuits DP1 to DPm may sample and hold in parallel digital pixel data transferred from the data receiving circuit 310 according to the reference clock, based on the data start signal and may output the reference clock and the held digital pixel data according to the serial data communication manner. In this case, each of the first to $m^{th}$ data processing circuits DP1 to DPm may be a minimum-unit microchip or one chipset and may be a semiconductor packaging device which includes an IC including transistors and has a fine size.

The first to $m^{th}$ data processing circuits DP1 to DPm may be grouped into first to $i^{th}$ data processing groups 13201 to 1320i, and in this case, each of the first to $i^{th}$ data processing groups 13201 to 1320i may include j data processing circuits.

On a group basis, the data processing circuits grouped into the first to $i^{th}$ data processing groups 13201 to 1320i may be connected to the first to $i^{th}$ common serial data buses CSB1 to CSBi in common. For example, each of the first to $j^{th}$ data processing circuits DP1 to DPj grouped into the first data processing group 13201 may receive corresponding digital pixel data, a corresponding reference clock, and a corresponding start signal through the first common serial data bus CSB1, the first common reference clock line RCL1, and the first data start signal line DSL1. Also, each of m−j+1$^{th}$ to $m^{th}$ data processing circuits DPm−j+1 to DPm grouped into the $i^{th}$ data processing group 1320i may receive corresponding digital pixel data, a corresponding reference clock, and a corresponding data start signal through the $i^{th}$ common serial data bus CSBi, the $i^{th}$ common reference clock line RCLi, and the $i^{th}$ data start signal line DSLi.

When digital pixel data having a corresponding number of bits is sampled and held, each of the first to $m^{th}$ data processing circuits DP1 to DPm may output a reference clock input thereto to a first clock transfer line CTL1 of each of first to $m^{th}$ pixel driving line groups LG1 to LGm and may output the held digital pixel data to a first pixel data transfer line DTL1 of each of the first to $m^{th}$ pixel driving line groups LG1 to LGm according to the serial data communication manner.

Each of the first to $m^{th}$ data processing circuits DP1 to DPm according to an aspect may include a latch circuit which samples and latches digital pixel data input through a corresponding common serial data bus CSB according to the reference clock in response to the data start signal, a counter circuit which counts the reference clock to generate a data output signal, and a clock bypass circuit which bypasses the reference clock input thereto.

In the display apparatus according to another aspect, all circuits for allowing the display panel 100 to display an image corresponding to an image signal supplied from the display driving system 700 may be implemented as microchips mounted on the substrate 110, thereby obtaining the same effect as that of the display apparatus illustrated in FIGS. 1 to 11. Also, the microchips may be more easily simplified and integrated, and since the display apparatus is directly connected to the display driving system 700 through one interface cable 710, a connection structure between the display apparatus and the display driving system 700 may be simplified. Accordingly, the display apparatus according to another aspect may have a single plate shape, and thus, may have an enhanced sense of beauty in design.

As described above, according to the aspects of the present disclosure, a connection structure between the display driving system and the display panel is simplified, and thus, a sense of beauty in design of the display apparatus is enhanced.

Moreover, according to the aspects of the present disclosure, each of the gate driving circuit and the data driving pixel for driving each pixel of the display panel may be implemented as a microchip mounted on a substrate, and thus, a process of forming at least one TFT for each pixel of a general display panel may be omitted.

The above-described feature, structure, and effect of the present disclosure are included in at least one aspect of the present disclosure, but are not limited to only one aspect. Furthermore, the feature, structure, and effect described in at least one aspect of the present disclosure may be implemented through combination or modification of other aspects by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:
1. A display apparatus comprising:
 a substrate including a display area including a plurality of pixel areas defined in a first direction and a second direction intersecting the first direction and a non-display area surrounding the display area;
 a plurality of pixels each including a pixel driving chip provided in a corresponding pixel area of the plurality of pixel areas and a light emission part connected to the pixel driving chip;
 a plurality of pixel data transfer lines sequentially transferring digital pixel data to pixel driving chips of pixels arranged in the first direction;
 a plurality of clock transfer lines sequentially transferring a reference clock to the pixel driving chips of the pixels arranged in the first direction;

a data driving chip array part provided in the non-display area and connected to the plurality of pixel data transfer lines and the plurality of clock transfer lines;

a timing controller chip array part generating the digital pixel data and the reference clock based on an image signal input thereto and supplying the digital pixel data and the reference clock to the data driving chip array part, wherein the timing controller chip array part includes;

an image signal receiving chip array including at least one image signal receiving chip generating the digital pixel data and the reference clock of one frame based on the input image signal;

an image quality improvement chip array including at least one image quality improvement chip improving a quality of an image based on the digital pixel data of the one frame;

a data control chip array including at least one data control chip aligning the digital pixel data having image quality improved by the image quality improvement chip array by units of one horizontal line based on the reference clock and supplying the aligned digital pixel data to the data driving chip array part, wherein the image signal is supplied to the image signal receiving chip array according to a V-by-one interface manner, and wherein the pixel driving chip allows the light emission part to emit light based on the digital pixel data and the reference clock input thereto.

2. The display apparatus of claim 1, wherein the pixel driving chip controls an emission time of the light emission part by units of frames.

3. The display apparatus of claim 1, wherein the pixel driving chip supplies a data current, corresponding to the digital pixel data, to the light emission part.

4. The display apparatus of claim 1, wherein the pixel driving chip includes:
 a data receiving terminal receiving the digital pixel data transferred through an adjacent pixel data transfer line;
 a clock receiving terminal receiving the reference clock transferred through an adjacent clock transfer line;
 a data transfer terminal outputting the digital pixel data input through the data receiving terminal;
 a clock output terminal outputting the reference clock input through the clock receiving terminal; and
 an anode connection terminal connected to the light emission part.

5. The display apparatus of claim 1, wherein the pixel driving chip includes:
 a pixel memory storing the digital pixel data; and
 a pixel driving circuit generating a data current based on the digital pixel data stored in the pixel memory and supplying the data current to the light emission part.

6. The display apparatus of claim 1, wherein the light emission parts of the plurality of pixels simultaneously emit light.

7. The display apparatus of claim 1, wherein the light emission parts of the plurality of pixels sequentially emit light by unit of a horizontal line.

8. The display apparatus of claim 1, further comprising: a first planarization layer disposed on the substrate to cover the pixel driving chip of each of the plurality of pixels; a line layer including the plurality of pixel data transfer lines and the plurality of clock transfer lines disposed on the first planarization layer; a second planarization layer covering the line layer; and an encapsulation layer covering the light emission part disposed on the second planarization layer.

9. The display apparatus of claim 8, wherein the light emission part includes:
 a plurality of anode electrodes provided in each of the plurality of pixel areas on the second planarization layer and connected to a corresponding pixel driving chip;
 a bank layer disposed on the second planarization layer to define an emission area on the plurality of anode electrodes;
 a light emitting layer disposed in the emission area on the plurality of anode electrodes; and
 a cathode electrode disposed on the light emitting layer.

10. The display apparatus of claim 8, further comprising a buffer layer disposed on the substrate to support the pixel driving chip of each of the plurality of pixels and covered by the first planarization layer,
 wherein the buffer layer includes a plurality of concave portions accommodating the pixel driving chip of each of the plurality of pixels.

11. A display apparatus including a substrate having a display area and non-display area, wherein a plurality of pixel areas is defined at the display area in a first direction and a second direction intersecting the first direction and the non-display area surrounding the display area, comprising:
 a pixel driving chip disposed in each pixel;
 a light emission part connected to the pixel driving chip;
 a plurality of pixel data transfer lines sequentially transferring digital pixel data to the pixel driving chip disposed in the pixel arranged in the first direction; and
 a plurality of clock transfer lines sequentially transferring a reference clock to the pixel driving chip disposed in the pixel arranged in the first direction;
 a data driving chip array part provided in the non-display area and connected to the plurality of pixel data transfer lines and the plurality of clock transfer lines;
 a timing controller chip array part generating the digital pixel data and the reference clock based on an image signal input thereto and supplying the digital pixel data and the reference clock to the data driving chip array part,
 wherein the timing controller chip array part includes;
 an image signal receiving chip array including at least one image signal receiving chip generating the digital pixel data and the reference clock of one frame based on the input image signal;
 an image quality improvement chip array including at least one image quality improvement chip improving a quality of an image based on the digital pixel data of the one frame;
 a data control chip array including at least one data control chip aligning the digital pixel data having image quality improved by the image quality improvement chip array by units of one horizontal line based on the reference clock and supplying the aligned digital pixel data to the data driving chip array part,
 wherein the image signal is supplied to the image signal receiving chip array according to a V-by-one interface manner, and
 wherein the pixel driving chip controls an emission time of the light emission part by unit of frames and supplies a data current to the light emission part corresponding to the digital pixel data.

12. The display apparatus of claim 11, wherein the pixel driving chip includes:
 a data receiving terminal receiving the digital pixel data transferred through an adjacent pixel data transfer line;

a clock receiving terminal receiving the reference clock transferred through an adjacent clock transfer line;

a data transfer terminal outputting the digital pixel data input through the data receiving terminal;

a clock output terminal outputting the reference clock input through the clock receiving terminal; and an anode connection terminal connected to the light emission part.

13. The display apparatus of claim 11, wherein the pixel driving chip includes:

a pixel memory storing the digital pixel data; and a pixel driving circuit generating a data current based on the digital pixel data stored in the pixel memory and supplying the data current to the light emission part.

* * * * *